United States Patent
Ozaki

(10) Patent No.: US 7,821,047 B2
(45) Date of Patent: Oct. 26, 2010

(54) SEMICONDUCTOR APPARATUS AND METHOD FOR MANUFACTURING THE SAME

(75) Inventor: Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 11/862,721

(22) Filed: Sep. 27, 2007

(65) Prior Publication Data
US 2008/0079046 A1    Apr. 3, 2008

(30) Foreign Application Priority Data
Sep. 28, 2006  (JP)  ............................. P2006-265310

(51) Int. Cl.
*H01L 27/108* (2006.01)

(52) U.S. Cl. .................. 257/295; 257/296; 257/301; 257/303; 257/306; 257/309; 257/330; 257/331; 257/E27.091; 257/E27.095; 257/E27.096; 257/E27.104

(58) Field of Classification Search ......... 257/295–296, 257/300–301, 303, 330–331, E21.664, E21.655, 257/306, 308, 309, E27.091, E27.095, E27.096, 257/E27.104; 365/145, 187
See application file for complete search history.

(56) References Cited

U.S. PATENT DOCUMENTS

| | | | |
|---|---|---|---|
| 6,504,198 B2 * | 1/2003 | Morimoto | ............... 257/295 |
| 6,858,492 B2 * | 2/2005 | Bruchhaus et al. | ......... 438/253 |
| 6,897,502 B2 | 5/2005 | Watanabe et al. | |
| 7,091,537 B2 * | 8/2006 | Ozaki | ........................ 257/295 |
| 2005/0121709 A1 | 6/2005 | Ozaki | |
| 2006/0214206 A1 * | 9/2006 | Shuto | ........................ 257/295 |

FOREIGN PATENT DOCUMENTS

| | | |
|---|---|---|
| JP | 2004-335918 | 11/2004 |
| JP | 2005-174977 | 6/2005 |

* cited by examiner

*Primary Examiner*—Jerome Jackson, Jr.
*Assistant Examiner*—Yu Chen
(74) *Attorney, Agent, or Firm*—Oblon, Spivak, McClelland, Maier & Neustadt, L.L.P.

(57) ABSTRACT

According to an aspect of the present invention, there is provided a semiconductor apparatus including: a semiconductor substrate; an element isolation region formed in the semiconductor substrate so as to extend in a first direction; a gate electrode formed in the semiconductor substrate so as to extend in a second direction crossing the first direction and to penetrate through the element isolation region; a gate insulating film interposed between the gate electrode and the semiconductor substrate; an interlayer dielectric film formed on the gate electrode; a ferroelectric capacitor including: first and second electrodes disposed on the interlayer dielectric film and a ferroelectric between the first and second electrodes; and first and second semiconductor pillars being in contact respectively with the first and second electrodes.

9 Claims, 19 Drawing Sheets

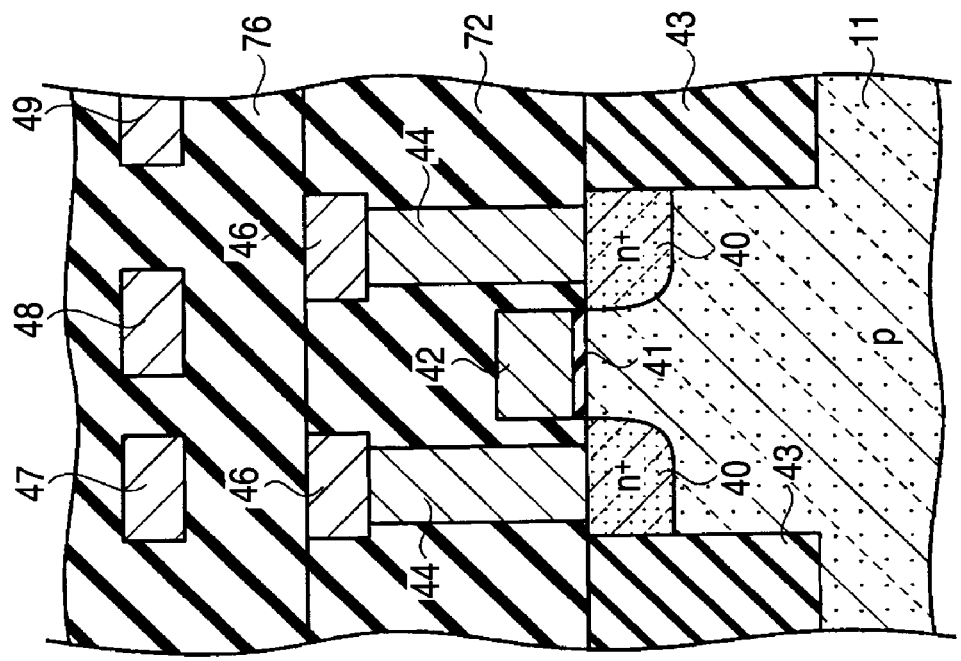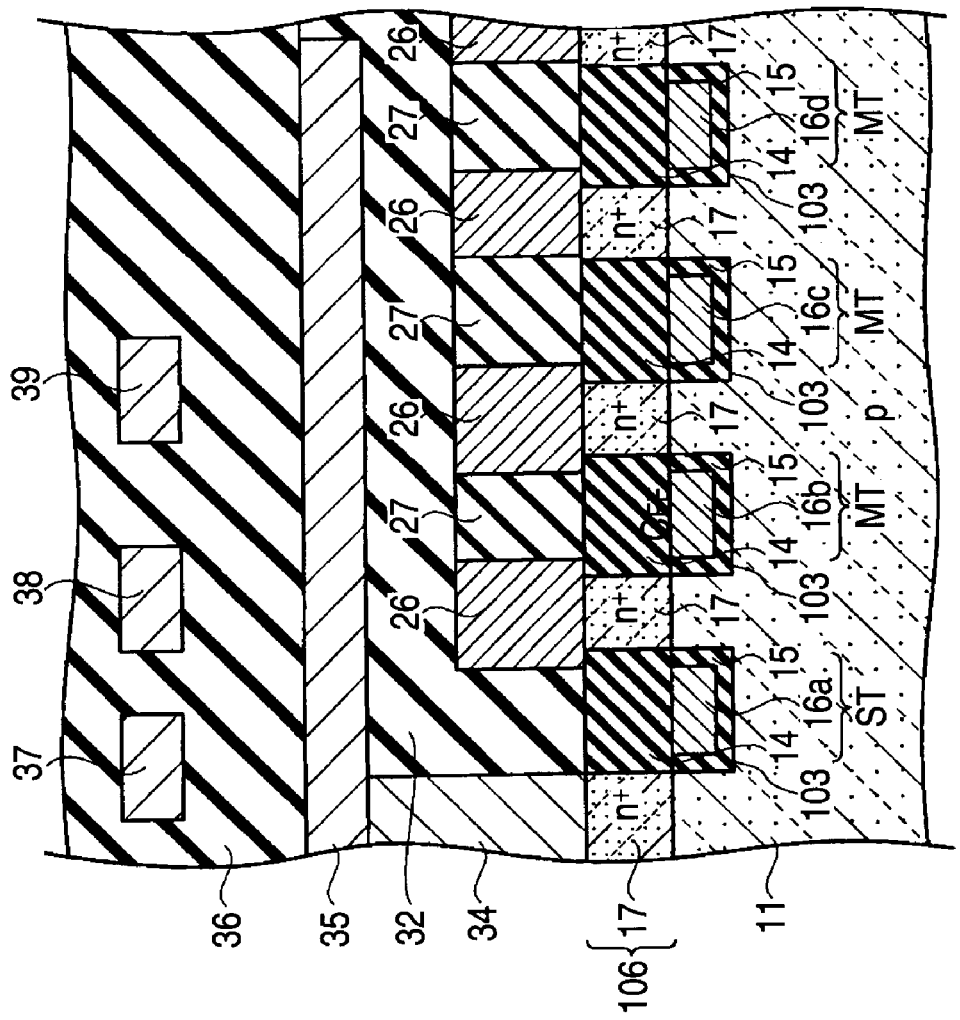

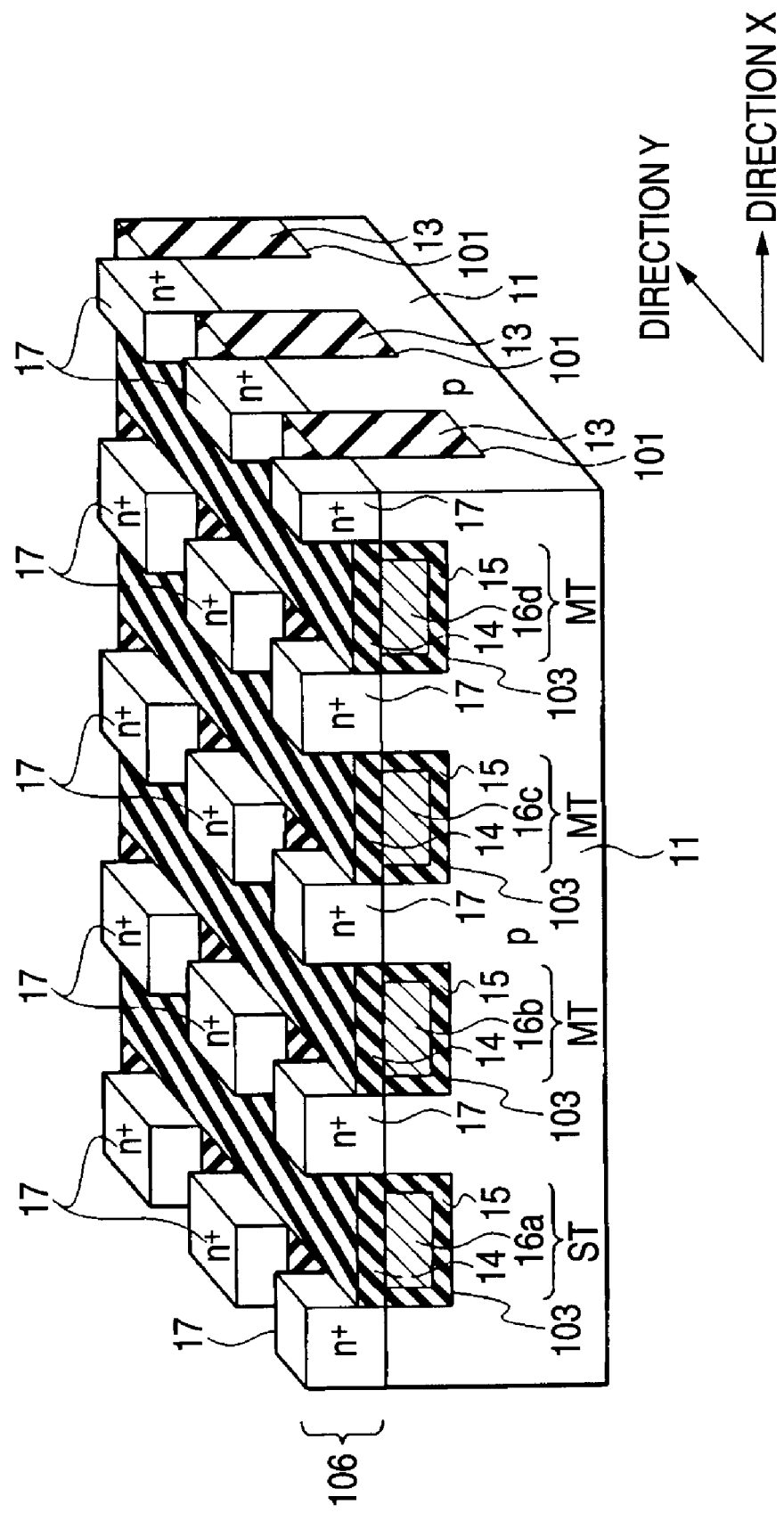

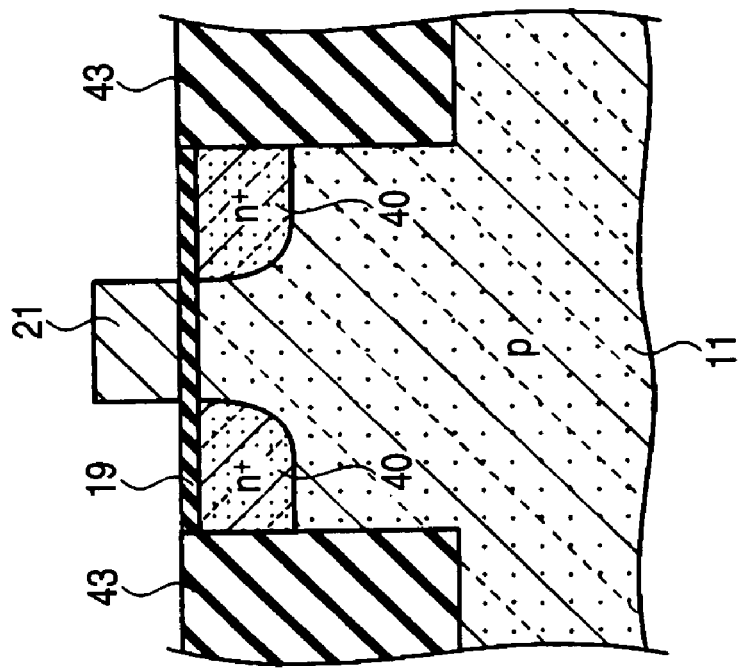
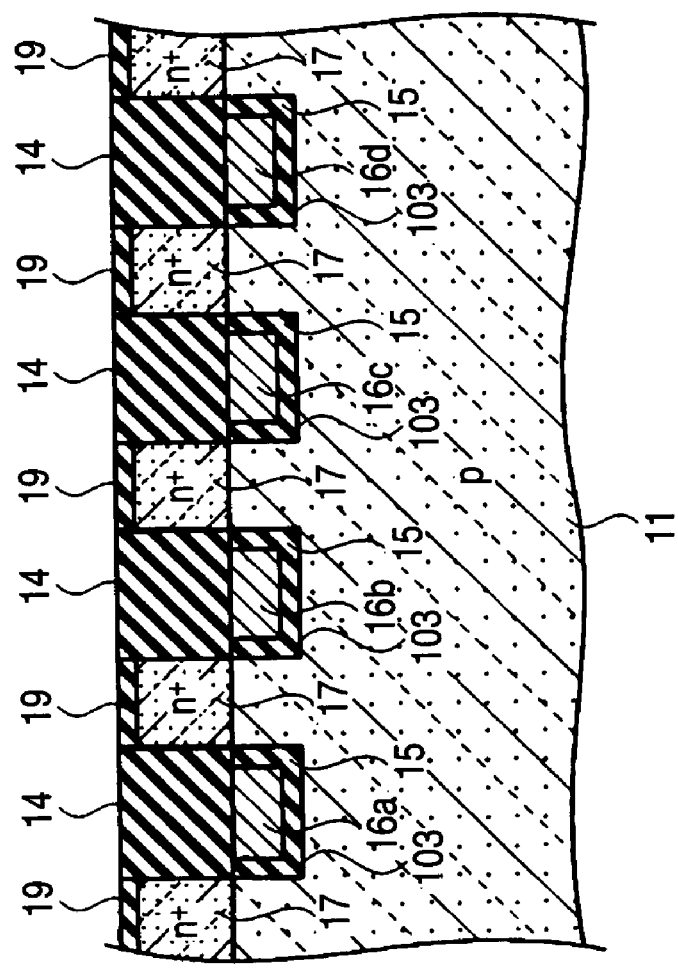

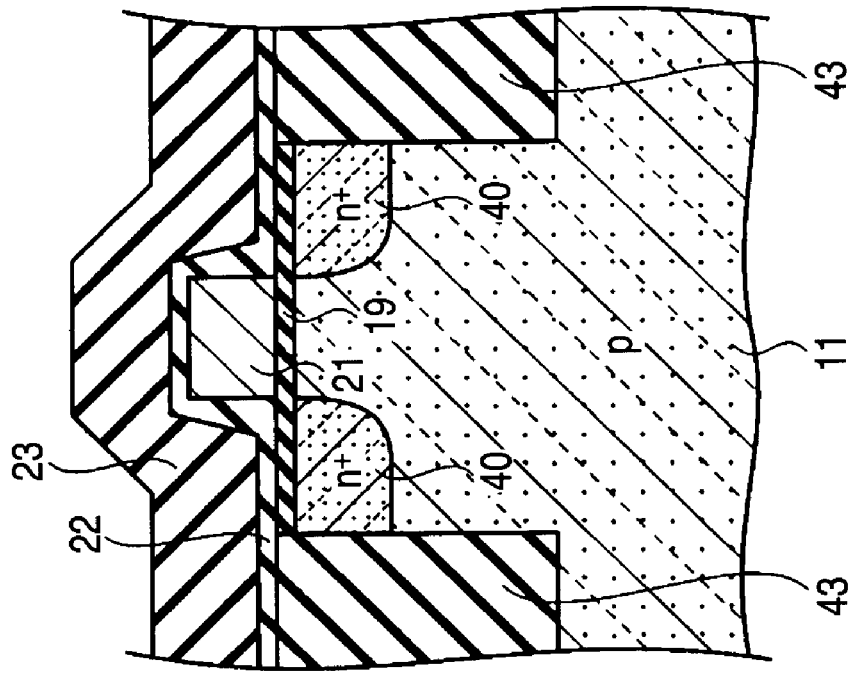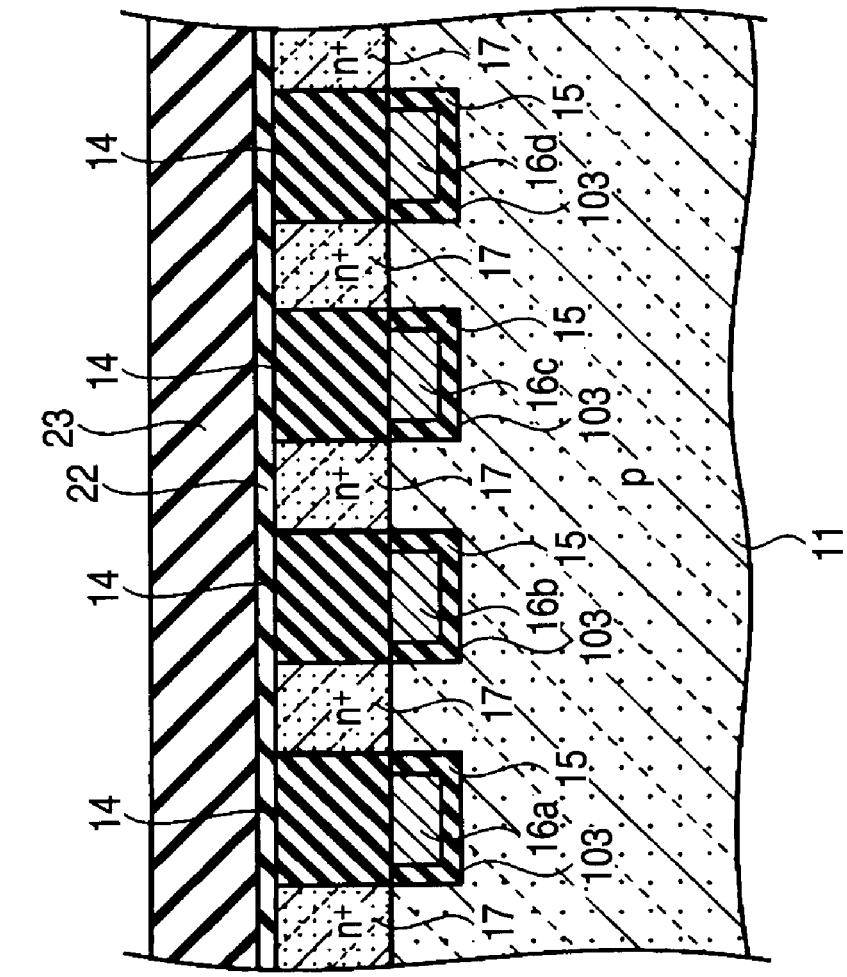

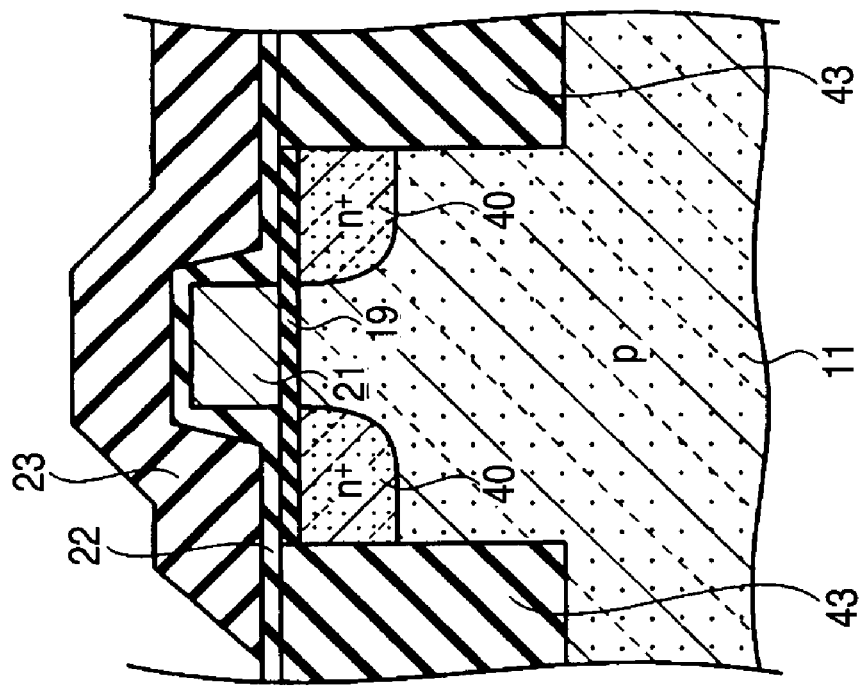
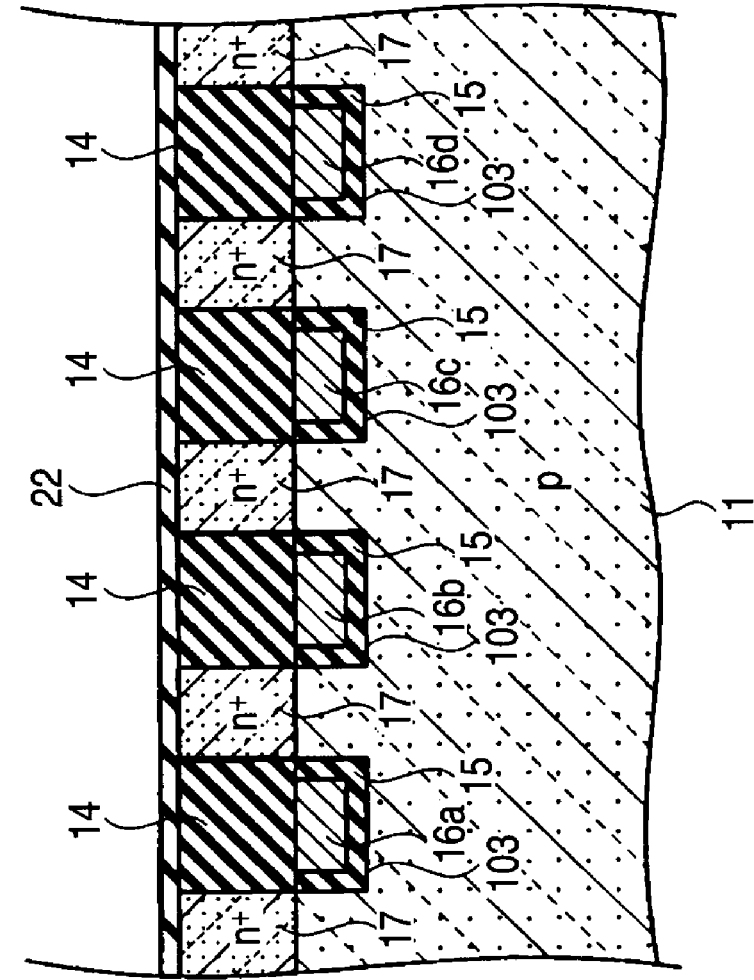
FIG. 12A
FIG. 12B

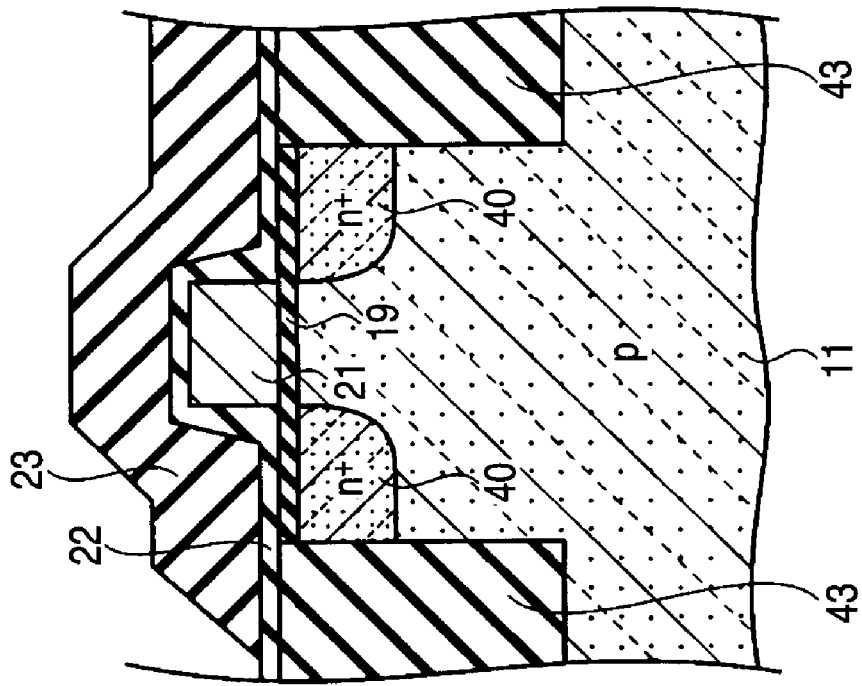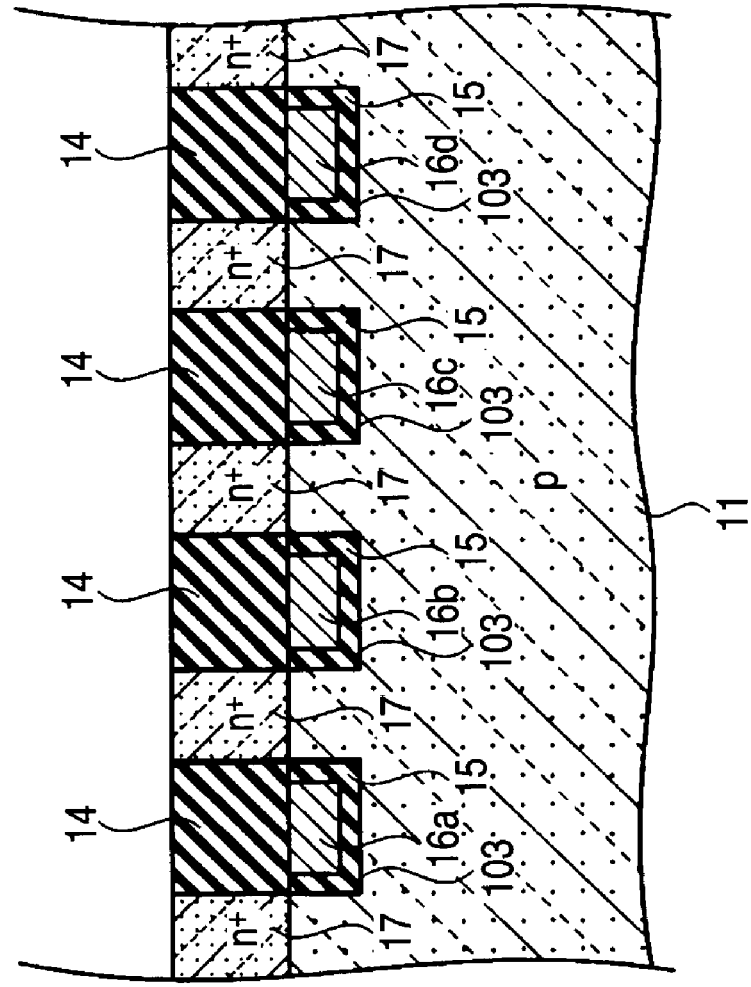

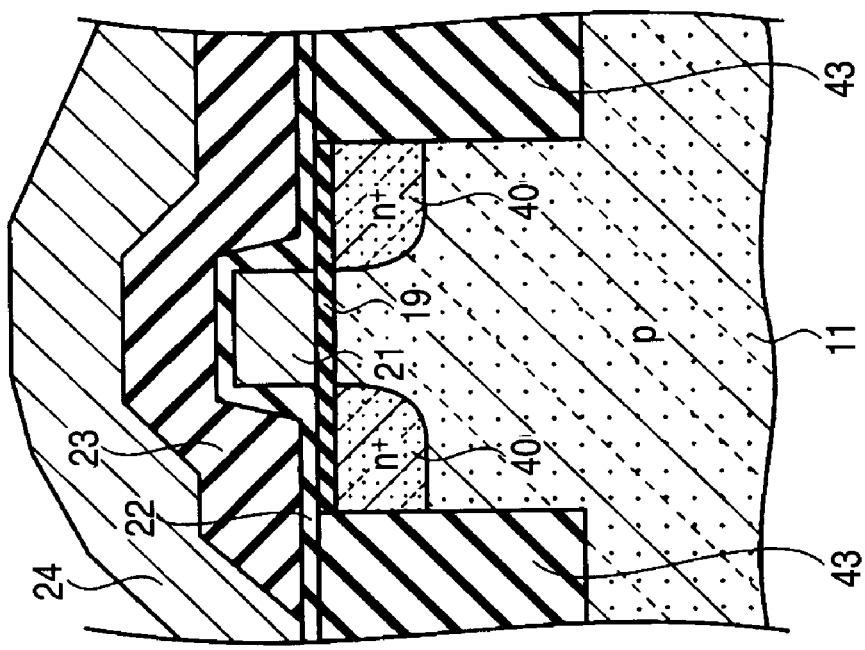
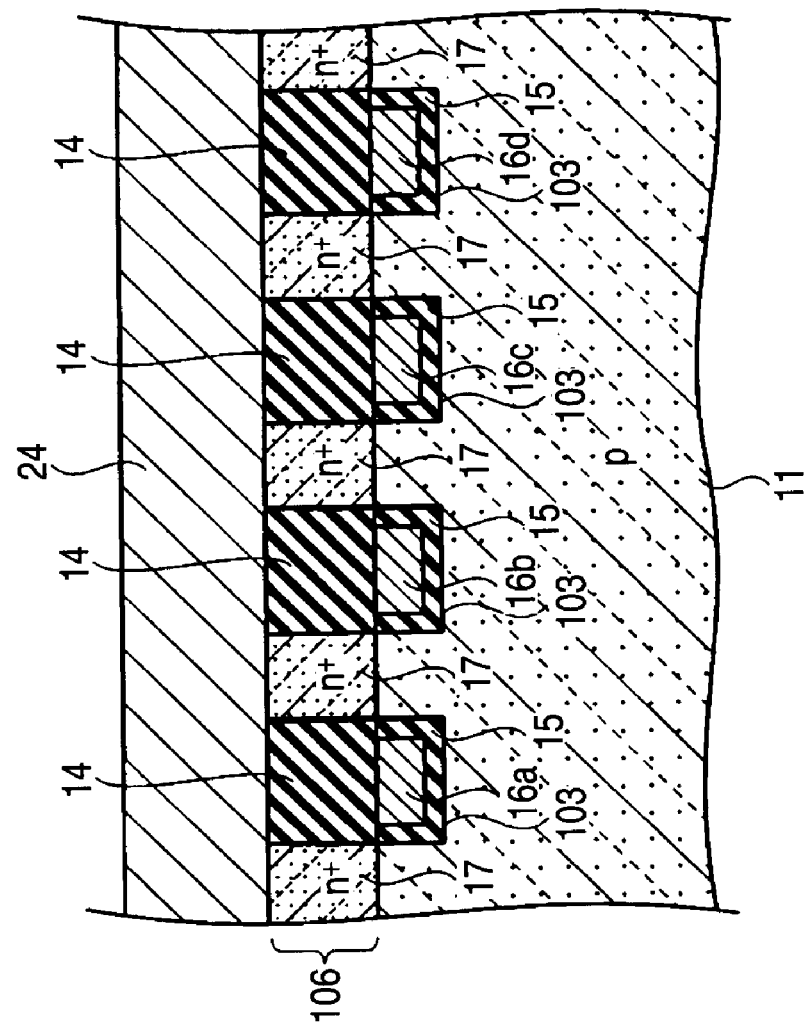
FIG. 14A
FIG. 14B

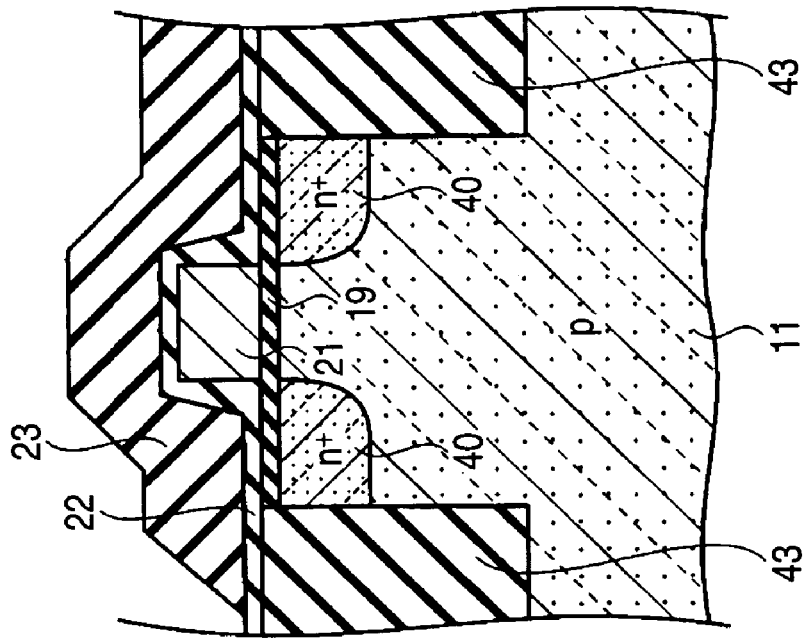
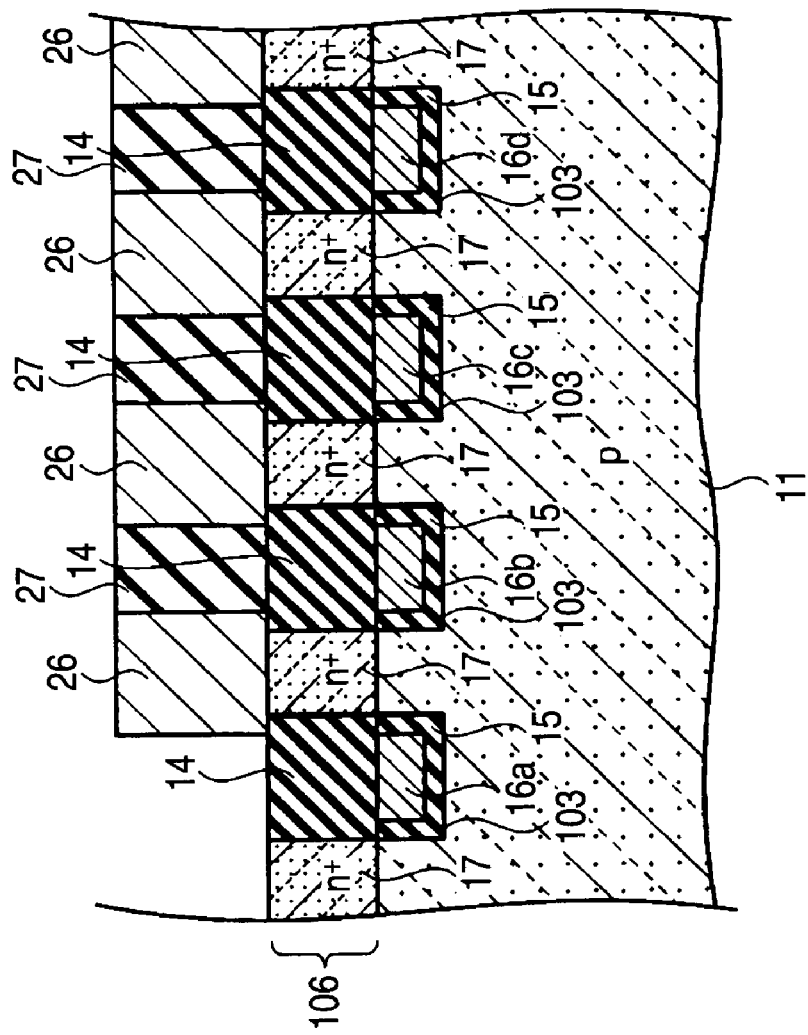

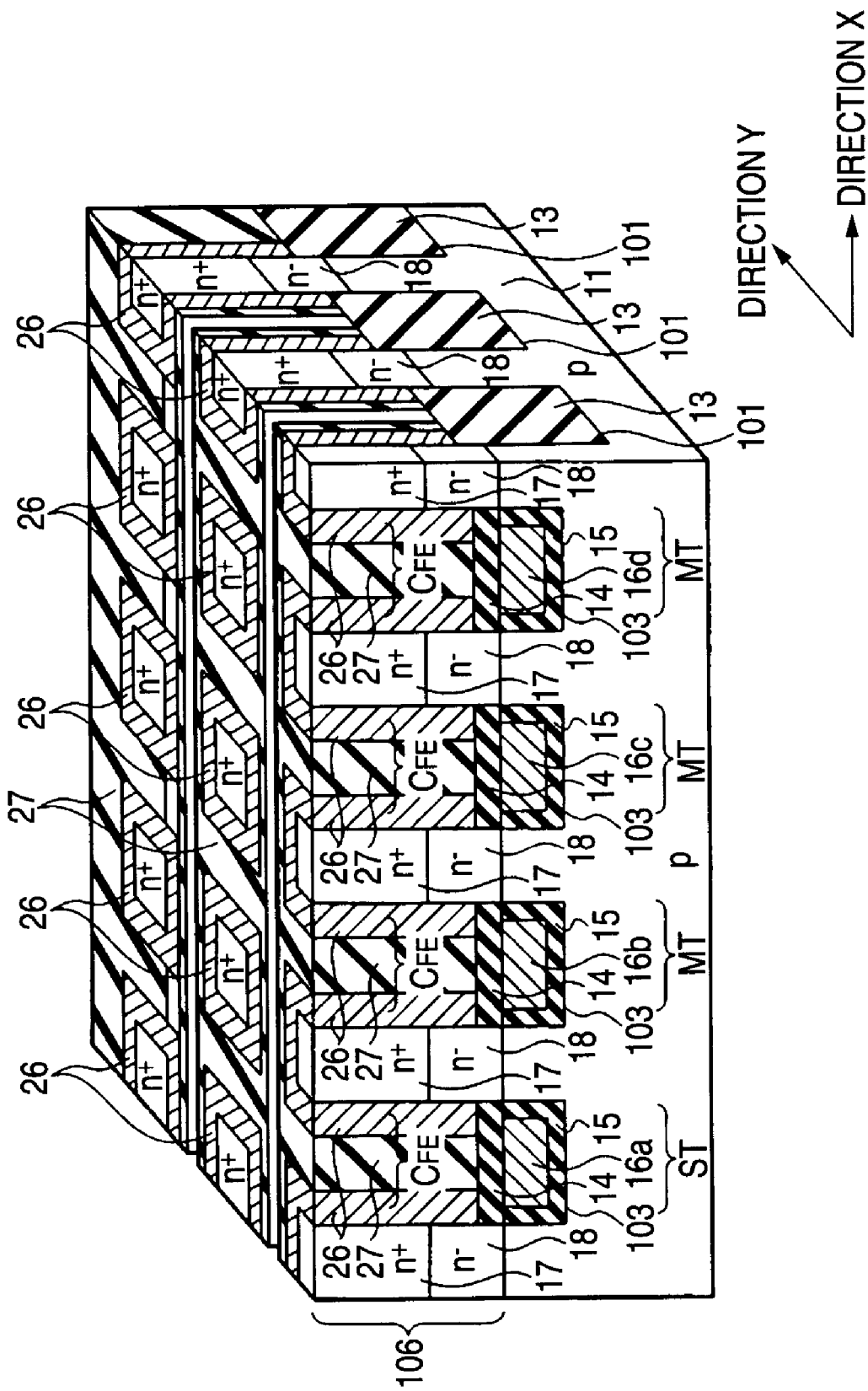

SEMICONDUCTOR APPARATUS AND METHOD FOR MANUFACTURING THE SAME

CROSS-REFERENCE TO RELATED APPLICATIONS

The entire disclosure of Japanese Patent Application No. 2006-265310 filed on Sep. 28, 2006 including specification, claims, drawings and abstract is incorporated herein by reference in its entirety.

BACKGROUND OF THE INVENTION

1. Field of the Invention

The present invention relates to a semiconductor device and a method for manufacturing the same, and more particularly to a semiconductor device and a method for manufacturing the same which are applied to a ferroelectric storage device (FeRAM: Ferroelectric Random Access Memory), or the like.

2. Description of the Related Art

Attention has recently been paid, as one of nonvolatile semiconductor memory devices, to a ferroelectric storage device (FeRAM) using a ferroelectric capacitor. In view of an area penalty, a Capacitor On Plug (COP) structure is adopted. In the COP structure, the ferroelectric capacitor is disposed above a memory cell transistor, and a capacitor electrode of the ferroelectric capacitor is connected with a source region or a drain region of the memory cell transistor through a contact plug (see, e.g., JP-2005-174977-A and US-2005-0121709-A). Also, from a viewpoint of an increase in operation margin, a Chain-FeRAM™ is proposed. In the Chain-FeRAM™, a unit cell includes the memory cell transistor MT and the ferroelectric capacitor $C_{FE}$ connected electrically in parallel with each other, and plurality of the unit cells are connected in series.

However, in the COP structure, the depth from a metal interconnecting wire that is disposed above the ferroelectric capacitor to a semiconductor substrate becomes larger. It results in a difficulty in forming a contact opening and embedding the contact opening with metal, thereby deteriorating a production yield of a contact plug (see; for example, JP-2004-335918-A and U.S. Pat. No. 6,897,502).

SUMMARY OF THE INVENTION

According to an aspect of the present invention, there is provided a semiconductor apparatus including: a semiconductor substrate; an element isolation region formed in the semiconductor substrate so as to extend in a first direction; a gate electrode formed in the semiconductor substrate so as to extend in a second direction crossing the first direction and to penetrate through the element isolation region; a gate insulating film interposed between the gate electrode and the semiconductor substrate; an interlayer dielectric film formed on the gate electrode; a ferroelectric capacitor including: a first electrode that is disposed on the interlayer dielectric film, a second electrode that is disposed on the interlayer dielectric film and that is separated from the first electrode, and a ferroelectric that is disposed on the interlayer insulating film and between the first electrode and the second electrode; a first semiconductor pillar that is in contact with the first electrode; and a second semiconductor pillar that is in contact with the second electrode.

According to another aspect of the present invention, there is provided a method for manufacturing a semiconductor apparatus, the method including: forming a first trench that extends in a first direction and that has a first depth, in a semiconductor substrate; forming a second trench that extends in a second direction crossing the first trenches and that has a second depth smaller than the first depth, in the semiconductor substrate; forming an element isolation region by disposing an insulating film in the first trench; forming a transistor in a lower region of the second trench by performing a transistor forming process; and forming a ferroelectric capacitor in an upper region of the second trench by performing a capacitor forming process.

According to still another aspect of the present invention, there is provided a semiconductor apparatus including: a semiconductor substrate including: a first semiconductor pillar, a second semiconductor pillar, and a trench formed between the first semiconductor pillar and the second semiconductor pillar; a gate insulating film formed in the trench; a gate electrode disposed on the gate insulating film; an interlayer dielectric film formed on the gate electrode; and a ferroelectric capacitor including: a first electrode that is disposed on the interlayer dielectric film and that is in contact with the first semiconductor pillar, a second electrode that is disposed on the interlayer dielectric film, that is in contact with the second semiconductor pillar and that is separated from the first electrode, and a ferroelectric that is disposed on the interlayer insulating film and between the first electrode and the second electrode.

BRIEF DESCRIPTION OF THE DRAWINGS

Embodiment may be described in detail with reference to the accompanying drawings, in which:

FIG. 8A is a diagrammatic cross-sectional view of the memory cell section of the second embodiment, and FIG. 8B is a diagrammatic cross-sectional view of the control circuit section of the second embodiment;

FIG. 9 is a diagrammatic perspective view showing the three-dimensional configuration of the memory cell section of one process in the method for manufacturing the semiconductor device of the second embodiment;

FIG. 10A is a diagrammatic perspective view showing a three-dimensional configuration of the memory cell section of one step in a method for manufacturing the semiconductor device of the second embodiment, and FIG. 10B is a diagrammatic cross-sectional view of the control circuit section of one step in a method for manufacturing the semiconductor device of the second embodiment;

FIG. 11A is a diagrammatic cross-sectional view of the memory cell section of one step in a method for manufacturing the semiconductor device of the second embodiment, and FIG. 11B is a diagrammatic cross-sectional view of the control circuit section of one step in a method for manufacturing the semiconductor device of the second embodiment;

FIG. 12A is a diagrammatic cross-sectional view of the memory cell section of one step in a method for manufacturing the semiconductor device of the second embodiment, and FIG. 12B is a diagrammatic cross-sectional view of the control circuit section of one step in a method for manufacturing the semiconductor device of the second embodiment;

FIG. 13A is a diagrammatic cross-sectional view of the memory cell section of one step in a method for manufacturing the semiconductor device of the second embodiment, and FIG. 13B is a diagrammatic cross-sectional view of the control circuit section of one step in a method for manufacturing the semiconductor device of the second embodiment;

FIG. 14A is a diagrammatic cross-sectional view of the memory cell section of one step in a method for manufacturing the semiconductor device of the second embodiment, and FIG. 14B is a diagrammatic cross-sectional view of the control circuit section of one step in a method for manufacturing the semiconductor device of the second embodiment;

FIG. 16A is a diagrammatic cross-sectional view of the memory cell section of one step in a method for manufacturing the semiconductor device of the second embodiment, and FIG. 16B is a diagrammatic cross-sectional view of the control circuit section of one step in a method for manufacturing the semiconductor device of the second embodiment;

FIG. 17 is a diagrammatic perspective view showing a three-dimensional configuration of a memory cell section of a semiconductor device according to a third embodiment;

DETAILED DESCRIPTION OF THE INVENTION

Embodiments of the present invention will now be described by reference to the drawings. In the following descriptions about the drawings, identical or analogous elements are assigned identical or analogous reference symbols are assigned. It should be noted that the drawings are diagrammatic and differ from an actual device. Moreover, as a matter of course, a difference also exists among the drawings in terms of a dimension and a proportion.

Embodiments provided below are intended for exemplifying a device and a method for embodying the technical idea of the present invention. The technical idea of the present invention does not limit a layout of constituent elements, or the like, to that provided below. The technical idea of the present invention is liable to various alterations within the scope of the appended claims.

According to semiconductor devices of embodiments and a method for manufacturing the same, Chain-FeRAM™ adopts a vertical capacitor cell structure in which a ferroelectric capacitor is placed on a memory cell transistor in parallel to a surface of a semiconductor substrate. Occurrence of a decrease in the yield of a contact plug is prevented while the memory cell transistor is miniaturized.

According to semiconductor devices of embodiments and a method for manufacturing the same, a memory cell transistor is formed as an embedded transistor, and a structure on the semiconductor substrate can be formed to a lower height. Moreover, a ferroelectric capacitor is also formed on the embedded transistor or in a trench of the embedded transistor, thereby further reducing the height of the structure on the semiconductor substrate.

First Embodiment

Element Structure

Figure 1:
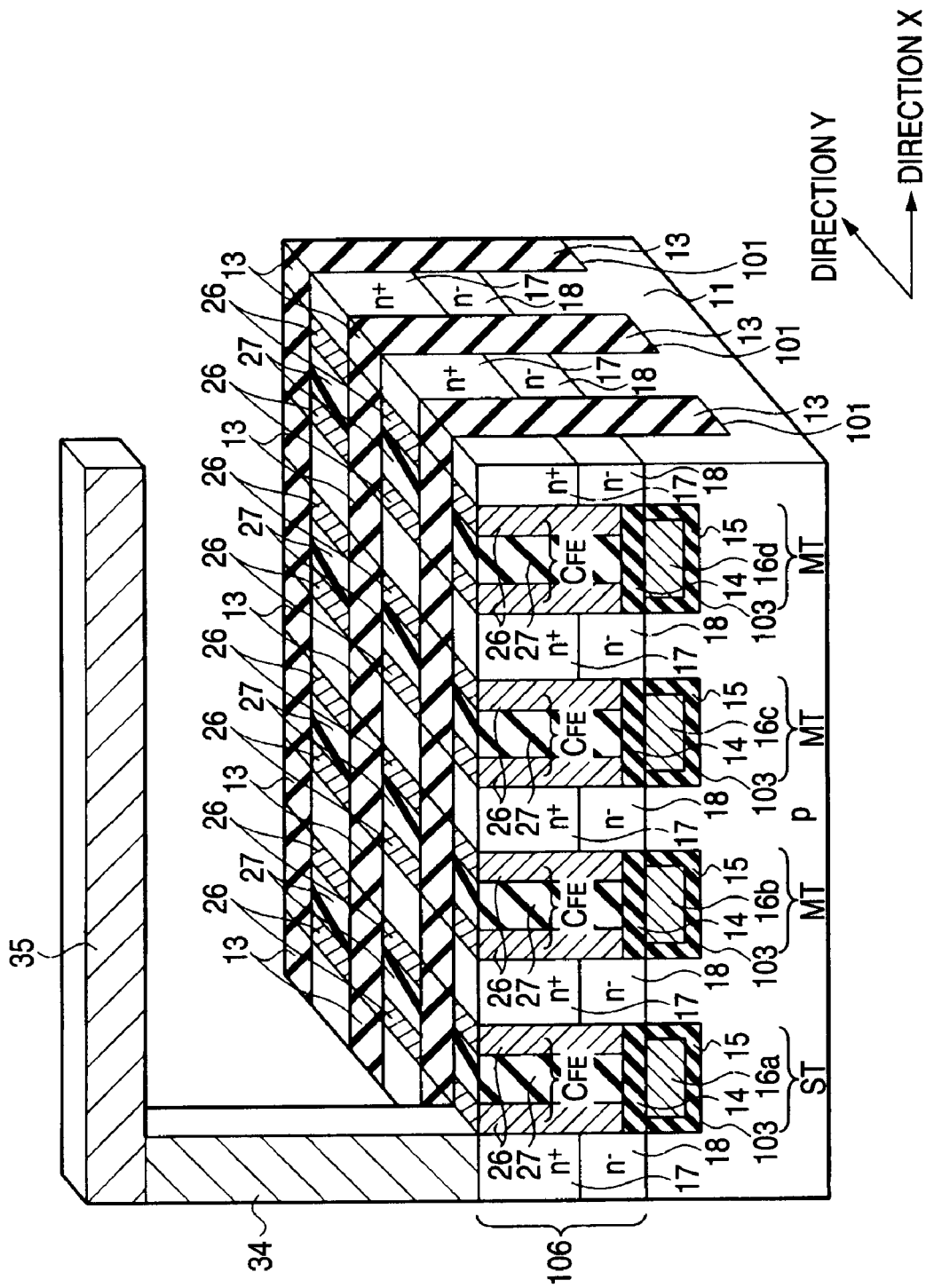
FIG. 1 is a diagrammatic perspective view showing a three-dimensional configuration of a memory cell section of a semiconductor device according to a first embodiment.
Figure 2A:
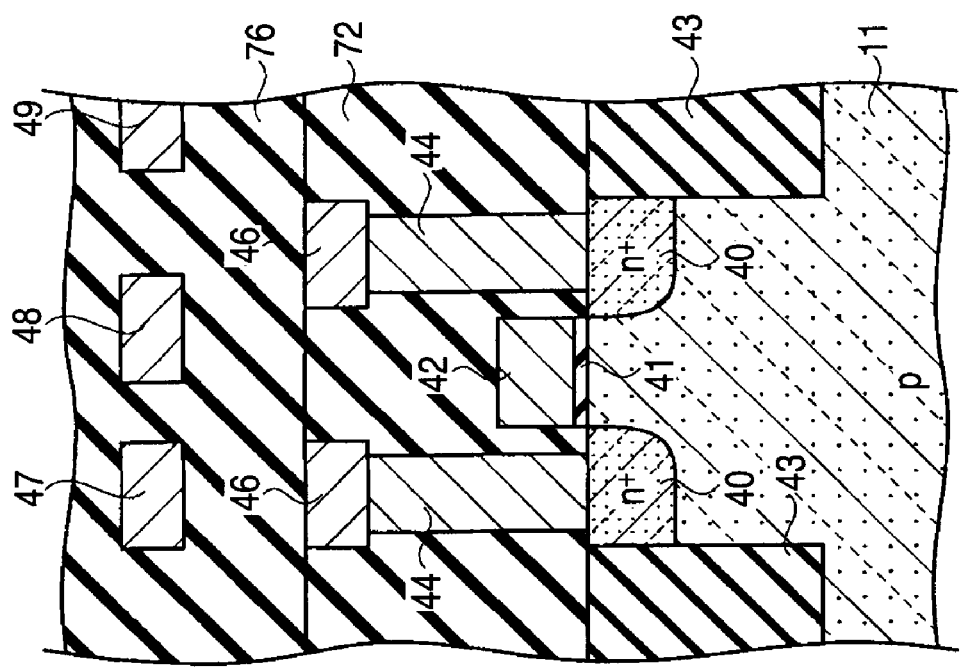
FIG. 2A is a diagrammatic cross-sectional view of a memory cell section of the semiconductor device according to the first embodiment.

A three-dimensional structure of a semiconductor device according to a first embodiment is diagrammatically represented as shown in FIG. 1. In the semiconductor device of the first embodiment, a diagrammatic cross-sectional structure of a memory cell section is depicted as shown in FIG. 2A. A diagrammatic cross-sectional structure of a control circuit section located around the memory cell section is depicted as shown in FIG. 2B.

Figure 2B:
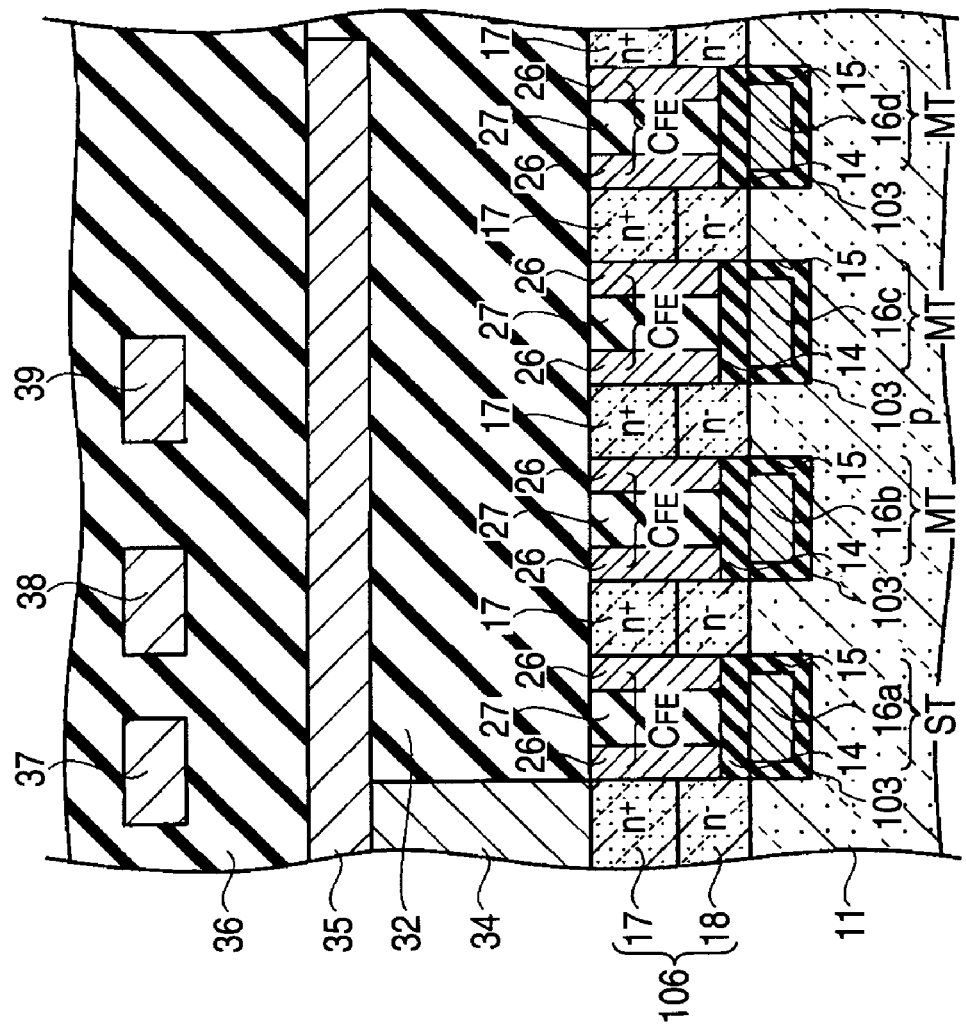
FIG. 2B is a diagrammatic cross-sectional view of a control circuit section of the semiconductor device according to the first embodiment.

As shown in FIGS. 1, 2A and 2B, a semiconductor device of the first embodiment has a semiconductor substrate 11; element isolation trenches 101 that are formed in the semiconductor substrate 11, that extend in direction X, and that have a first depth; transistor trenches 103 that are formed in the semiconductor substrate 11, that extend in direction Y crossing the element isolation trench 101, that have a second depth shallower than the first depth, and that have an upper region and a lower region; and element isolation regions 13 formed by embedding the respective element isolation trenches 101 with an insulating film.

The semiconductor device is provided with gate electrodes 16a, 16b, 16c, and 16d which are placed in lower regions of the respective transistor trenches 103 through a gate insulting film 15 and which extend in the direction Y; and an interlayer insulating film 14 which is formed on the gate electrodes 16a, 16b, 16c, and 16d in the respective transistor trenches 103. The semiconductor device is further provided with source regions 17 provided in respective first semiconductor pillars formed from portions of the semiconductor substrate 11 located close to one side of the respective transistor trenches 103; and drain regions 17 provided in respective second semiconductor pillars formed from portions of the semiconductor substrate 11 located close to the other side of the respective transistor trenches 103.

The semiconductor device also has ferroelectric capacitors $C_{FE}$. Each of the capacitors is provided, along the direction X, in an upper portion of the transistor trench 103 between the first semiconductor pillar and the second semiconductor pillar. The capacitor includes a source electrodes 26 is connected to the source region 17; a drain electrode 26 connected to the drain region 17; and a ferroelectric film 27 interposed between the source electrode and the drain electrode.

In the above description and the configuration shown in FIG. 1, each of the source region 17 and the drain region 17 is formed as an n⁺ semiconductor region.

Channels are formed around the gate electrodes 16a, 16b, 16c, and 16d within the semiconductor substrate 11.

Embedded transistors are vertically formed in the shape of the letter U with the gate electrodes 16a, 16b, 16c, and 16d sandwiched therebetween. One of main electrodes is assumed to be taken as a source region, and the other electrode is taken as a drain region. Consequently, an electrode connected to the source region comes to be a source electrode 26, and an electrode connected to the drain region comes to be a drain electrode 26. In particular, in the case of Chain-FeRAM™, memory cell transistors MT are connected in series. Hence, a drain region and a source region or a source region and a drain region are commonly connected between adjacent memory cell transistors.

Here, the direction X corresponds to a columnar direction along which a bit line BL extends, and the direction Y corresponds to a row direction along which a word line WL extends.

Moreover, the source electrodes 26 are also positioned along both sides of the first semiconductor pillar in the second direction as well as along both sides of the first semiconductor pillar in the first direction, to thus surround the sides of the first semiconductor pillar. The drain electrodes 26 are also positioned along both sides of the second semiconductor pillar in the second direction as well as along both sides of the second semiconductor pillar in the first direction, to thus surround the sides of the second pillar.

Moreover, an interlayer insulating film 32 is placed on the semiconductor substrate 11. The semiconductor device includes a first metal electrode layer 35 formed in an embedded manner in the interlayer insulating film 32; bit line contact plugs 34, each of which connects the first metal electrode layer 35 to the source/drain regions 17 in the semiconductor substrate 11; and second metal electrode layers 37, 38, and 39 formed in an embedded manner in an interlayer insulating film 36 laid on the first metal electrode layer 35.

An insulating film is embedded in the respective element isolation trenches 101 extending in the direction X, thereby forming the element isolation regions 13. The transistor trenches 103 are formed so as to extend in the direction Y orthogonal to the element isolation regions 13. The gate electrodes 16a, 16b, 16c, and 16d are embedded in the respective transistor trenches 103 through the gate insulating film 15 so as to extend in the direction Y. Mutually-opposing source/drain electrodes 26 are formed on both sides of respective semiconductor pillar 106 which are each determined from the element isolation trench 101 and the transistor trench 103. The ferroelectric films 27 are formed among the source/drain electrodes 26, whereby the ferroelectric capacitors $C_{FE}$ are formed electrically in parallel to the memory cell transistors MT.

Figure 18:
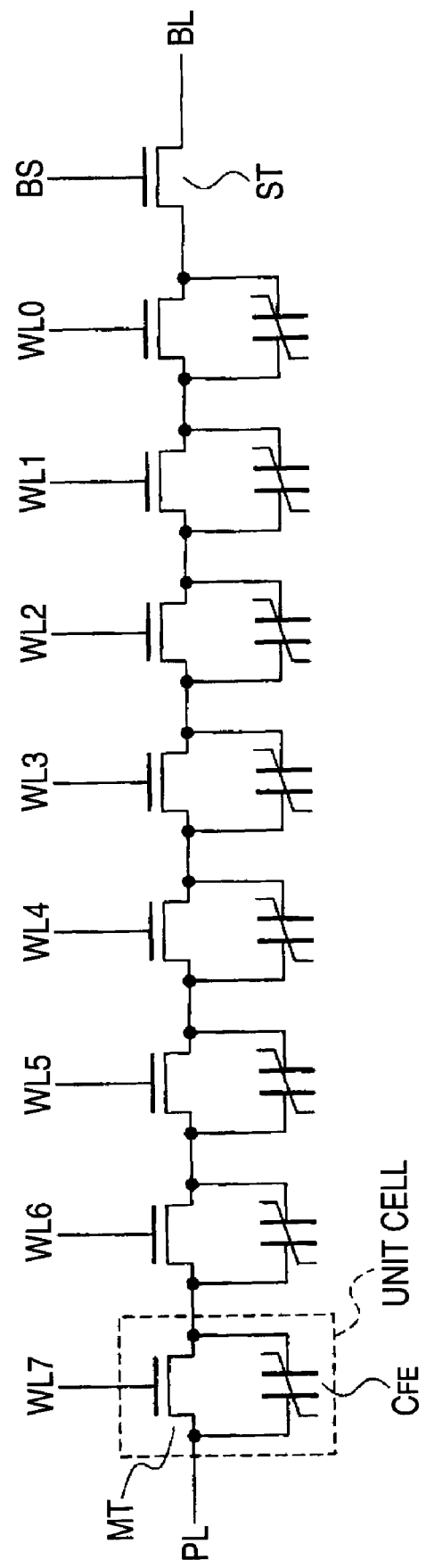
FIG. 18 is a schematic circuit diagram of a Chain-FeRAM™ cell block to which the semiconductor devices of the first through third embodiments can be applied.

As shown in FIG. 1, the memory cell transistors MT respectively having the gate electrodes 16b, 16c, and 16d are connected in series, thereby forming a group called a block. A block selection transistor ST having a gate electrode 16a is formed at the end of the block so as to assume the structure of an embedded transistor that is identical to the structure of the memory cell transistor MT. A bit line contact plug 34 is formed in one of semiconductor pillars 106 of each block selection transistor ST and connected to each bit line BL formed from the metal electrode layer 35. As a result, the memory cell transistor MT and the block selection transistor ST are formed in a fully-embedded form within the semiconductor substrate 11. Hence, the thickness of the interlayer insulating film 32 between the first metal electrode layer 35 and the semiconductor substrate 11 can be made small, so that the bit line contact plug 34 can be formed to the same depth as that of an ordinary logic device. An example circuit configuration is as shown in FIG. 18 which will be described later.

In the meantime, an example of a diagrammatic cross-sectional structure of the control circuit section in the semiconductor device of the first embodiment is shown in FIG. 2B.

The semiconductor substrate 11, element isolation regions 43, source/drain regions 40, a gate insulating film 41 formed on areas of the semiconductor substrate 11 located between the source/drain regions 40; and gate electrodes 42 placed on the gate insulating film 41 are provided. The control circuit section is provided with contact plugs 44 located on the respective source/drain regions 40 and a first metal electrode layer 46 placed on each of the contact plugs 44. The control circuit section also includes an interlayer insulating film 72 laid on the semiconductor substrate 11, the gate electrodes 42, and the first metal electrode layer 46, and second metal electrode layers 47, 48, and 49 formed so as to be embedded in an interlayer insulating film 76 on the first metal electrode layer 46.

The element isolation regions 43 may also be formed concurrently with formation of the element isolation regions 13 of the memory cell section. The source/drain regions 40 may also be formed concurrently with formation of the source/drain regions 17 of the memory cell section. The contact plugs 44 placed on the respective source/drain regions 40 may also be formed concurrently with formation of the bit line contact plugs 34 of the memory cell section. The first metal electrode layer 46 laid on the contact plugs 44 may also be formed concurrently with formation of the first metal electrode layer 35 of the memory cell section. The interlayer insulating film 72 laid on the semiconductor substrate 11 and the gate electrodes 42 may also be formed concurrently with formation of the interlayer insulating film 32 of the memory cell section. The interlayer insulating film 76 laid on the first metal electrode layer 46 may also be formed concurrently with formation of the interlayer insulating film 36 of the memory cell section. The second metal electrode layers 47, 48, and 49 formed in an embedded manner in the interlayer insulating film 76 on the first metal electrode layer 46 may also be formed concurrently with formation of the second metal electrode layers 37, 38, and 39 of the memory cell section.

(Manufacturing Method)

The method for manufacturing the semiconductor device of the first embodiment is shown in FIGS. 3A-6.

The method includes the processes of: forming, in the semiconductor substrate 11, the element isolation trenches 101 that have the first depth and that extend in the direction X; and forming the embedded element isolation regions 13 in the respective element isolation trenches 101. Moreover, the method includes the processes of: forming, in the semiconductor substrate 11, the transistor trenches 103 which extend in the direction Y crossing the element isolation trench 101 and which each have the second depth smaller than the first depth and an upper region and a lower region; and forming the gate electrodes 16a, 16b, 16c, and 16d—which extend in the direction Y—in the lower regions of the respective transistor trenches 103 through the gate insulating film 15. The method includes the processes of: forming the interlayer insulating film 14 on the gate electrodes 16a, 16b, 16c, and 16d in the respective transistor trenches 103; and forming the source regions 17 in the respective first semiconductor pillars 106 formed from portions of the semiconductor substrate 11 close to one side of the respective transistor trenches 103 and the drain regions 17 in the respective second semiconductor pillars 106 formed from portions of the semiconductor substrate 11 close to the other side of the respective transistor trench 103. The method further includes the processes of: forming the ferroelectric capacitors $C_{FE}$, each of which is positioned in the upper region, along the direction X, on the interlayer insulating film 14 of the transistor trench 103 and which includes the source electrode 26 connected to the source region 17, the drain electrode 26 connected to the drain region 17, and the ferroelectric film 27 interposed between the source electrode and the drain electrode.

Figure 3A:
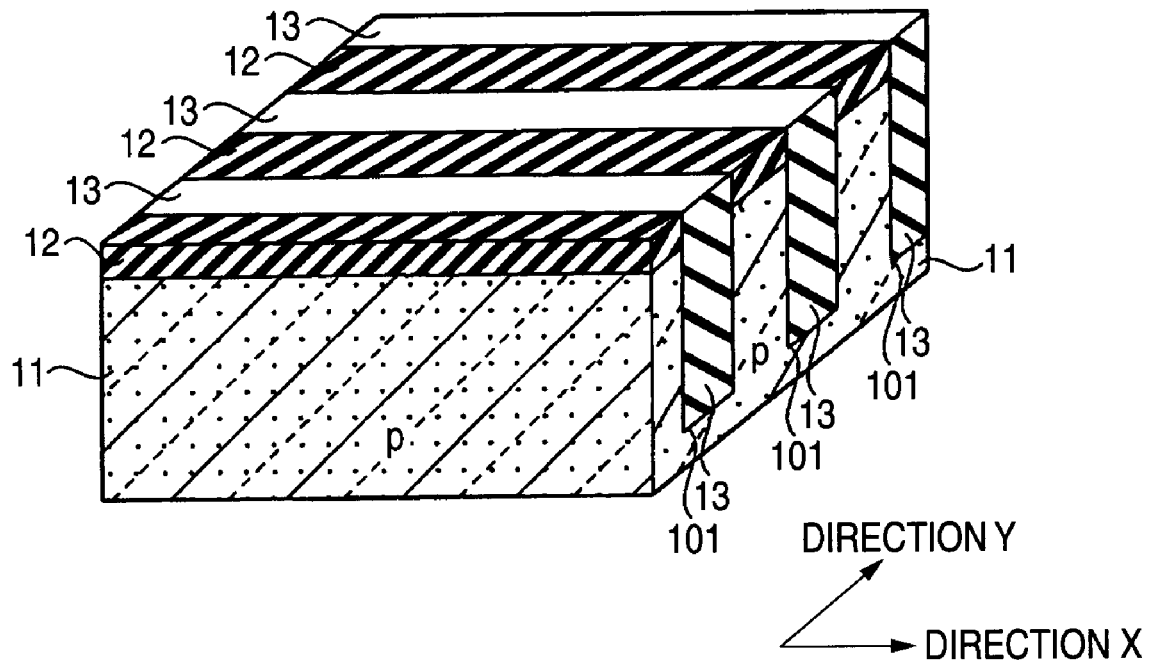
FIG. 3A is a diagrammatic perspective view of the memory cell section of one step of a method for manufacturing the semiconductor device of the first embodiment.
Figure 3B:
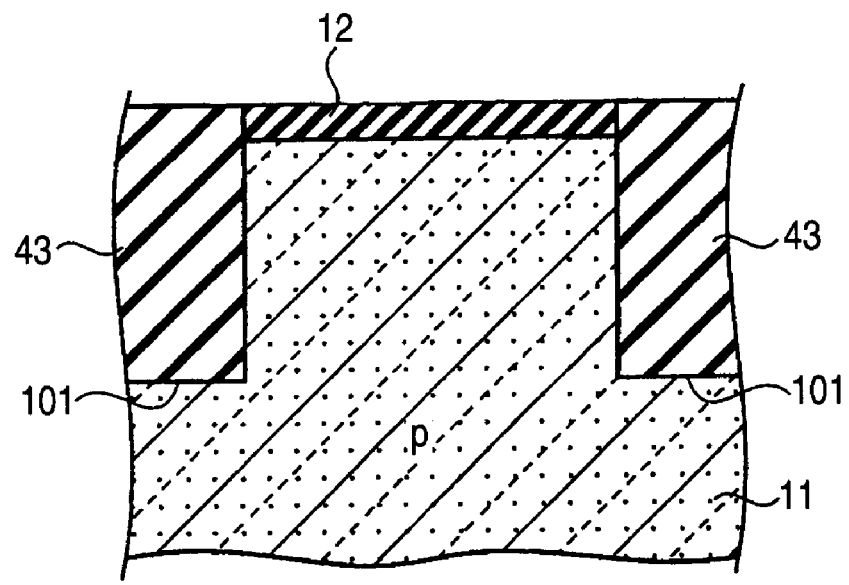
FIG. 3B is a diagrammatic cross-sectional view of the control circuit section of one step of a method for manufacturing the semiconductor device of the first embodiment.
Figure 4A:
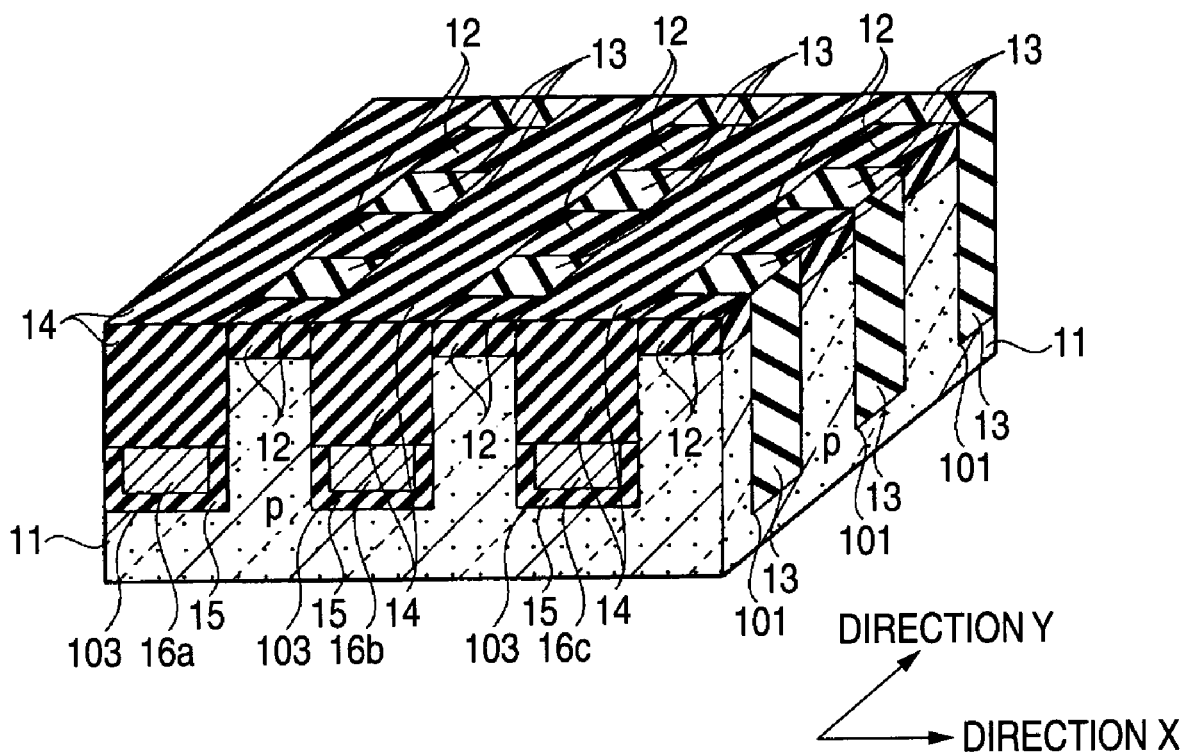
FIG. 4A is a diagrammatic perspective view showing a three-dimensional configuration of the memory cell section of one step in a method for manufacturing the semiconductor device of the first embodiment.
Figure 4B:
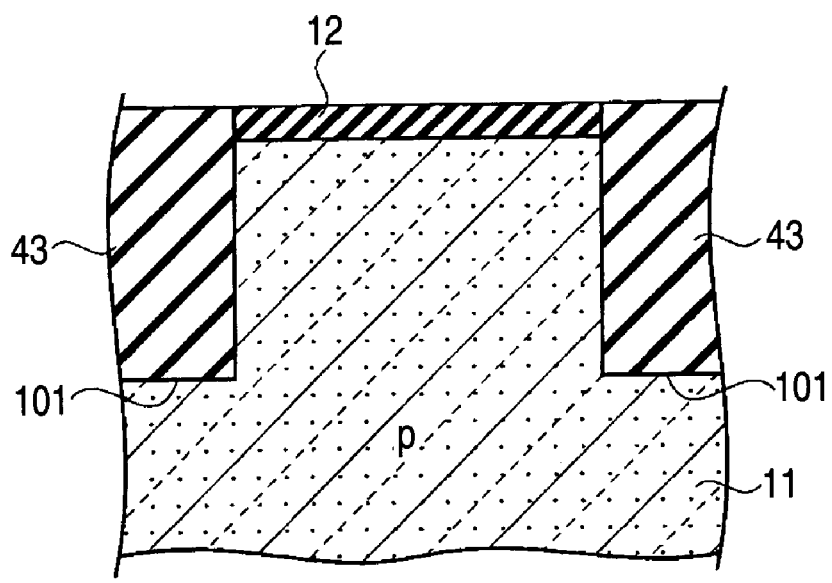
FIG. 4B is a diagrammatic cross-sectional view of the control circuit section of one step in a method for manufacturing the semiconductor device of the first embodiment.
Figure 5:
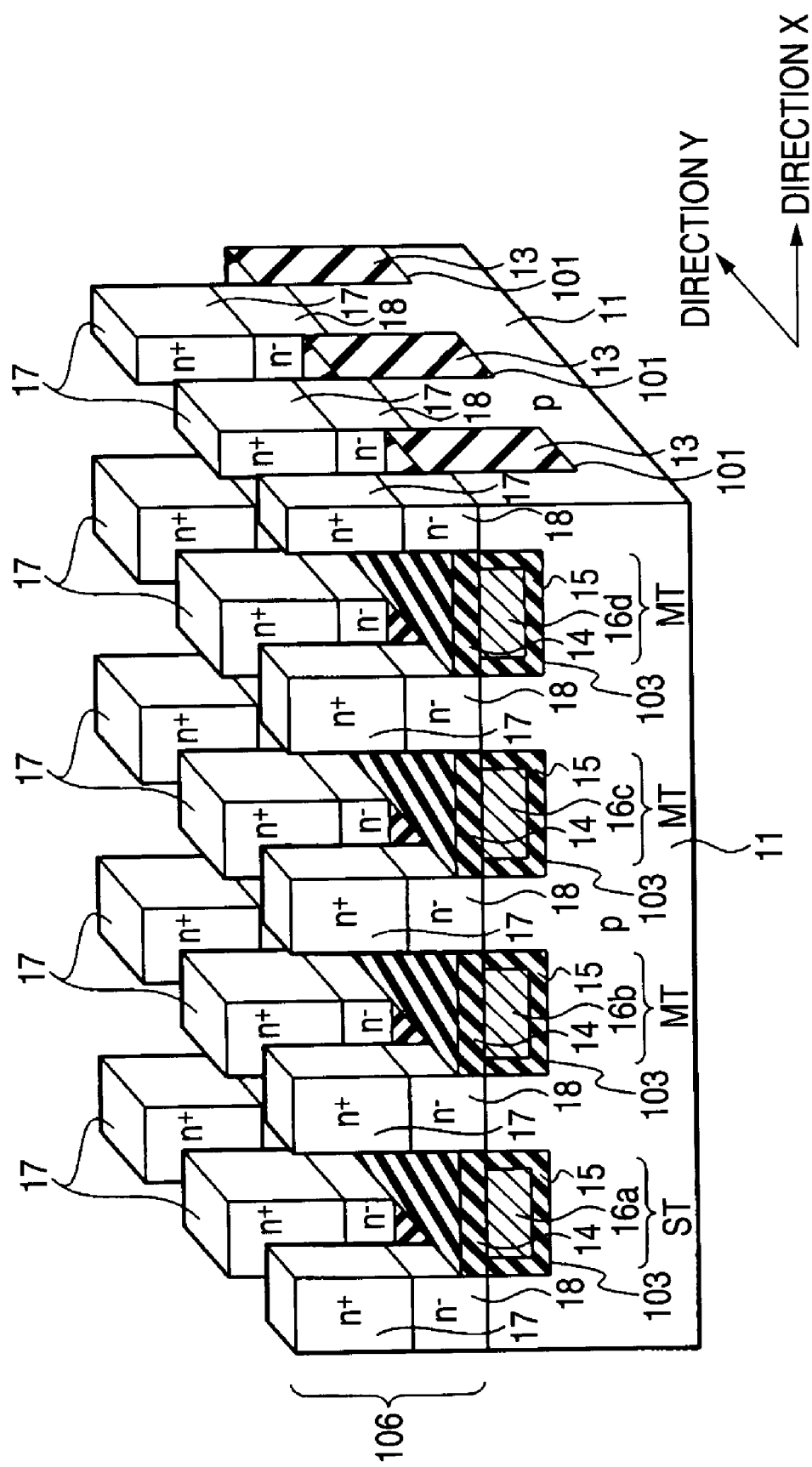
FIG. 5 is a diagrammatic perspective view showing the three-dimensional configuration of the memory cell section of one process in the method for manufacturing the semiconductor device of the first embodiment.
Figure 6:
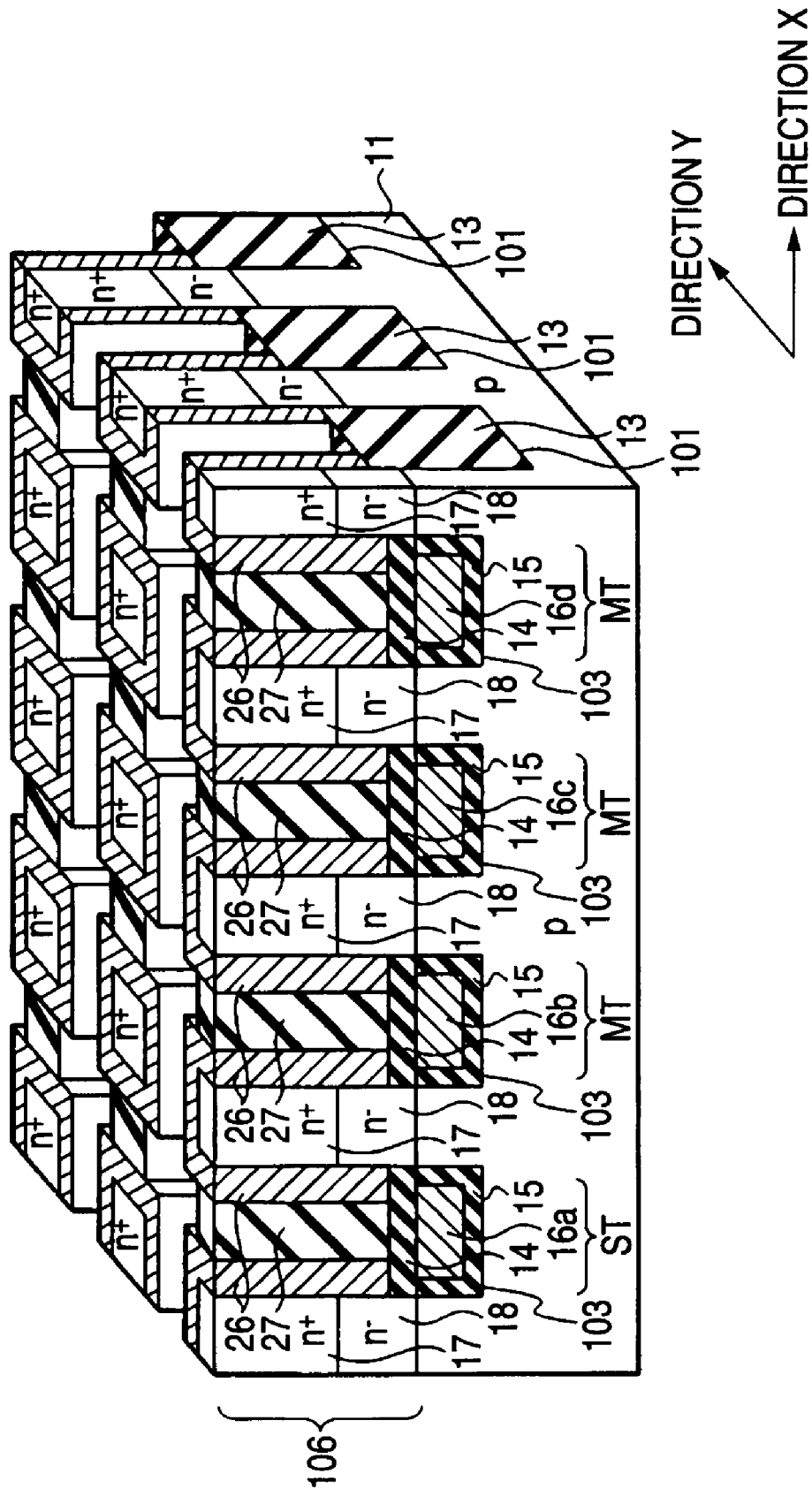
FIG. 6 is a diagrammatic perspective view showing the three-dimensional configuration of the memory cell section of one process in the method for manufacturing the semiconductor device of the first embodiment.

FIGS. 3A-4B are descriptive views of one process of manufacturing the semiconductor device of the first embodiment. FIGS. 3A and 4A are diagrammatic perspective views showing a three-dimensional configuration of the memory cell section. FIGS. 3B and 4B are diagrammatic cross-sectional views of the control circuit section. FIGS. 5 and 6 are descriptive views of one process of the method for manufacturing a semiconductor device of the first embodiment; that is, diagrammatic perspective views showing an internal three-dimensional configuration of the memory cell.

The method for manufacturing the semiconductor device of the first embodiment will be described in detail hereunder.

(a) FIGS. 3A and 3B show views achieved after completion of a process for forming element isolation regions.

First, as shown in FIG. 3A, a silicon oxide film and a silicon nitride film are deposited on the semiconductor substrate 11 formed from; e.g., silicon, in the memory cell section, to thus form the element isolation trenches 101 so as to extend in the direction X. Subsequently, the element isolation trenches 101 are embedded with tetraethoxysilane (TEOS) or the like, to thus form the element isolation regions 13. Moreover, the element isolation regions are planarized by means of chemical-mechanical polishing (CMP), thereby making the nitride film 12 exposed. Likewise, as shown in FIG. 3B, the element isolation trenches 101 are formed in the control circuit section concurrently with formation of the element isolation trenches 101 of the memory cell section. The element isolation trenches 101 are embedded with TEOS, or the like, to thus form the element isolation regions 43. The element isolation regions are planarized by means of CMP, to thus make the nitride film 12 exposed. The silicon oxide film formed below the nitride film 12 is omitted from FIGS. 3A and 3B.

(b) FIGS. 4A and 4B show views achieved after completion of a process for forming embedded transistors.

As is the case with processing shown in FIGS. 3A and 3B, the transistor trenches 103 are first formed in the memory cell section so as to extend in the direction Y orthogonal to the element isolation trenches 101, as shown in FIGS. 4A and 4B. Moreover, after the gate insulating film 15 has been formed from a silicon oxide film, or the like, in the respective transistor trenches 103, the gate electrodes 16a, 16b, and 16c formed from; e.g., a doped amorphous silicon layer, or the like, are deposited. The gate electrodes are abraded by means of CMP, or the like, to thus become planarized. Further, the gate electrodes 16a, 16b, and 16c formed from a doped amorphous silicon layer, or the like, are subjected to recess-etching by means of etchback treatment. The interlayer insulating film 14, such as a TEOS, is further deposited, and the film is polished and planarized by means of CMP, or the like, thereby making the nitride film 12 exposed.

As in the case of the memory cell section, as a matter of course embedded transistors may also be formed even in the control circuit section. An example shown in FIG. 4B represents an illustration of a process for fabricating a transistor of planar gate structure analogous to the structure shown in FIG. 3B.

(c) FIG. 5 shows a view achieved after completion of a process for forming the semiconductor pillars 106.

After formation of the embedded transistor structures shown in FIGS. 4A and 4B, the interlayer insulating film 14, such as TEOS, is subjected to recess-etching by means of reactive ion etching (RIE) which is highly selective with regard to the nitride film 12, thereby automatically causing the semiconductor pillars 106 to appear. Moreover, after removal of the nitride film 12 in the memory cell section, a high-resistance semiconductor layer 18 and the source/drain regions 17 are formed by means of ion implantation or a diffusion process. The process for forming the high-resistance semiconductor layer 18 and the source/drain regions 17 does not need to be performed after formation of the semiconductor pillars 106. Specifically, after the high-resistance semiconductor layer 18 and the source/drain regions 17 have been formed by means of a well diffusion process or an ion implantation process, the process for forming element isolation regions shown in FIGS. 3A and 3B may also be commenced.

(d) FIG. 6 shows a view achieved after completion of a process for forming mutually-opposing electrodes.

Iridium (Ir) is deposited on the exposed sides of the semiconductor pillars 106 by means of atomic layer deposition (ALD), or the like. Subsequently, the Ir deposited on a bottom is removed by means of total etchback treatment, thereby leaving Ir only on the sides of the respective semiconductor pillars 106. Thus, the source/drain electrodes 26 that are to serve as mutually-opposing electrodes are formed.

Before the deposition of Iridium, a heat-resistive silicide layer, such as $CoSi_2$, may be formed on the sides of the semiconductor pillars to prevent occurrence of a silicidation reaction during Ir deposition.

Subsequently, the ferroelectric film 27, such as a lead zirconate titanate (PZT) film, is deposited by means of MOCVD (Metal Organic Chemical Vapor Deposition), or the like.

Subsequently, in this embodiment, the ferroelectric film 27 is patterned and removed in connection with the direction X orthogonal to the direction Y along which the gate electrodes 16b, 16c, and 16d of the memory cell transistors MT extend, as shown in FIG. 6.

The material for the source/drain electrodes 26 is not limited to Ir. $IrO_2$, a multilayer structure consisting of Ir and platinum (Pt), a multilayer structure consisting of $IrO_2$ and Pt, a multilayer structure consisting of Ir and titanium nitride, or a multilayer structure consisting of Ir and titanium aluminum nitride may also be used. Moreover, Pt, $IrO_2$, and SrRuO; or a multilayer structure consisting of Pt, $IrO_2$, and SrRuO, may also be adopted. Further, the material for the ferroelectric material 27 is not limited to PZT. An barium strontium titanate (SBT) film, a bismuth lanthanum titanate (BLT) film, and the like, may also be used. In addition, for instance, a silicon oxide film, a TiN film, a TiAlN film, and the like, can be used as a material of a mask employed during patterning of the source/drain electrodes 26 and the ferroelectric film 27.

The structure acquired after the process for forming mutually-opposing electrodes shown in FIG. 6 represents a structure in which the source/drain electrodes 26 are formed on all of side walls of the semiconductor pillars 106. In the meantime, concurrently with the process for pattering the ferroelectric film 27 or after the process for patterning the ferroelectric film 27, the source/drain electrodes 26 formed on the sidewalls opposing each other in the direction Y may also be etched away, and the source/drain electrodes 26 may also be left on only the sidewalls opposing each other in the direction X.

The structure shown in FIG. 1 represents a structure in which the source/drain electrodes 26 are left on only the side walls of the semiconductor pillar 106 that oppose each other in the direction X.

Next, after being deposited over the entirety of the structure, an insulating film, such as TEOS, is planarized by means of CMP, or the like, thereby embedding the element isolation trenches 101 with an insulating film, such as TEOS. Thus, the element isolation regions 13 are formed. An insulating film, such as TEOS, is embedded into points above the interlayer dielectric film 14 corresponding to the intersections of the element isolation trenches 101 and the transistor trenches 103, thereby insulating and isolating from each other the source/drain electrodes 26 that are adjacent to each other in the direction Y and the ferroelectric films 27 that are adjacent to each other in the direction Y.

(e) Next, as shown in FIG. 2B, after removal of the nitride film 12 in the control circuit section, the gate insulating film 41 and the gate electrode 42 of the transistor are formed. Subsequently, the source/drain regions 40 are formed by means of ion implantation in a self-alignment process, thereby fabricating transistors of the control circuit section.

The transistors of the control circuit section may also be fabricated after fabrication of the embedded transistors in the memory cell section shown in FIG. 4A.

Subsequently, as shown in FIG. 2A, after deposition of the interlayer insulating film 32, the bit line contact plug 34 is formed on the source/drain region 17 of each of the block selection transistors ST. Moreover, the first metal electrode layer 35 is formed on the bit line contact plugs 34. In addition, the second metal electrode layers 37, 38, and 39 are formed on the first metal electrode layer 35 in an embedded manner in the interlayer insulating film 36.

The first metal electrode layer 35 and the second metal electrode layers 37, 38, and 39 may also be formed in a metal damascene process.

Similarly, as shown in FIG. 2B, after deposition of the interlayer insulating film 72, the contact plugs 44 are formed on the respective source/drain regions 40. Further, the first metal electrode layer 46 is formed on each of the contact plugs 44. The second metal electrode layers 47, 48, and 49 are formed on the respective first metal electrode layers 46 in an embedded manner in the interlayer dielectric film 76.

The first metal electrode layer 46 and the second metal electrode layers 47, 48, and 49 may also be formed in the metal damascene process.

In the above processes, simultaneously forming the bit line contact plugs 34 and the contact plugs 44, simultaneously forming the first metal electrode layer 35 and the first metal electrode layer 46, simultaneously forming the second metal electrode layers 37, 38, and 39 and the second metal electrode layers 47, 48, and 49 are effective for enabling a decrease in the number of manufacturing processes.

The bit line contact plugs 34 and the contact plugs 44 are formed from a metal layer; for example, W, Cu, or the like. Moreover, the first metal electrode layers 35 and 46 and the second metal electrode layers 37, 38, 39, 47, 48, and 49 are formed from an Al electrode.

Alternatively, the first metal electrode layers 35 and 46 and the second metal electrode layers 37, 38, 39, 47, 48, and 49 may also be formed from silicide, such as W silicide, Cu silicide, Mo silicide, Pt silicide, Cu silicide, Co silicide, or the like.

Through the above processes, the memory cell section and the control circuit section are formed in the semiconductor device of the first embodiment.

According to the semiconductor device and the method for manufacturing the same of the first embodiment, the memory cell transistors can be formed within the semiconductor substrate in an embedded manner. Therefore, the thickness of the interlayer insulating film from the surface of the semiconductor substrate to the first metal interconnect layer can be reduced. The contact plugs between the first metal interconnect layer and the semiconductor substrate can be formed shallowly. Thus, occurrence of a decrease in the production yield of the contact plugs can be prevented.

Second Embodiment

Element Structure

Figure 7:
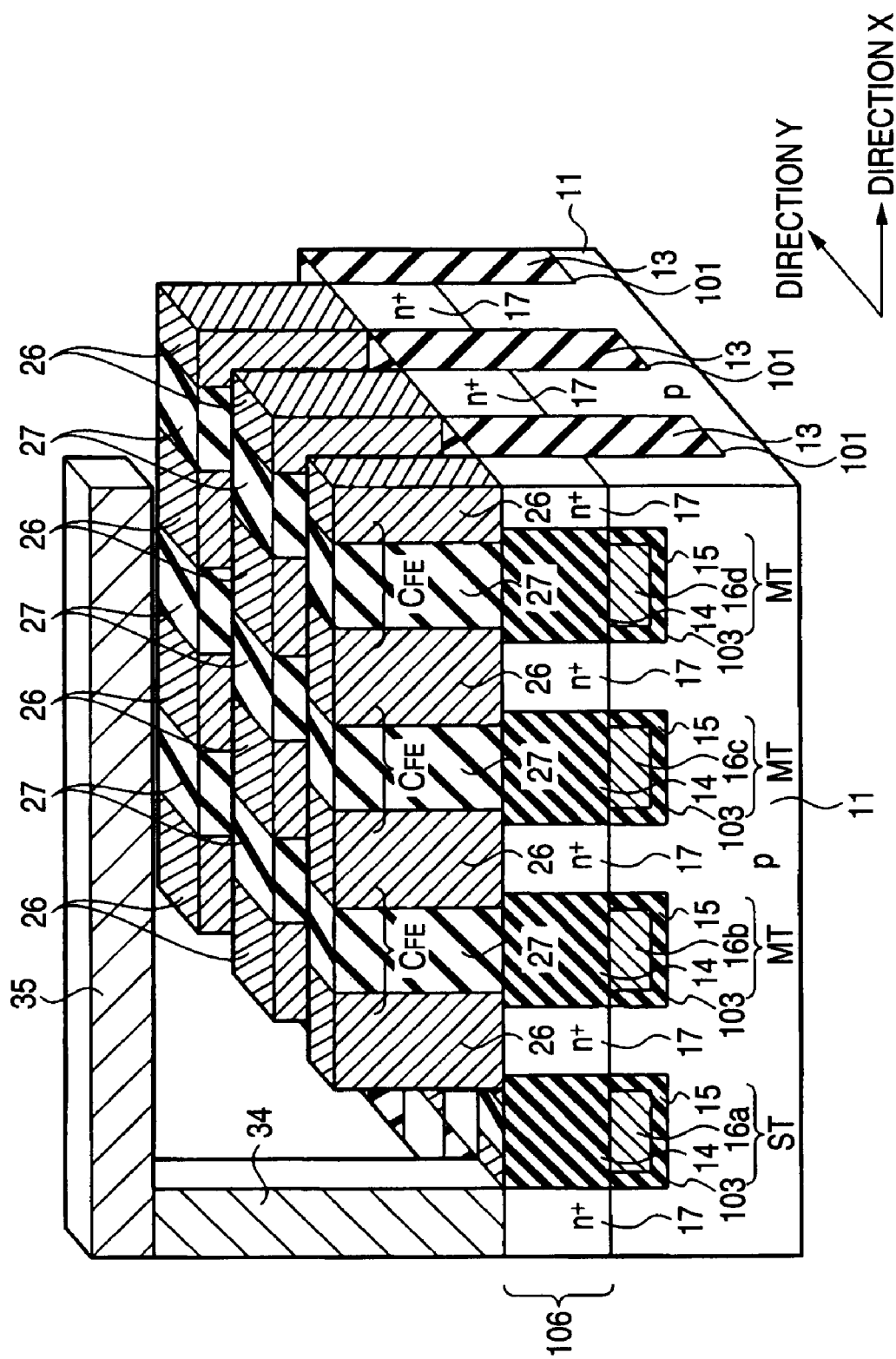
FIG. 7 is a diagrammatic perspective view showing a three-dimensional configuration of a memory cell section of a semiconductor device according to a second embodiment.

A three-dimensional structure of a semiconductor device according to a second embodiment is diagrammatically represented as shown in FIG. 7. In the semiconductor device of the second embodiment, a diagrammatic cross-sectional structure of a memory cell section is depicted as shown in FIG. 8A. A diagrammatic cross-sectional structure of a control circuit section located around the memory cell section is depicted as shown in FIG. 8B.

The semiconductor device of the first embodiment exhibits the structure in which the ferroelectric capacitors $C_{FE}$ and the memory cell transistors MT are fully embedded in the semiconductor substrate 11. However, forming the ferroelectric capacitors $C_{FE}$ in the transistor trenches 103 in an embedded manner results in an increase in the depth of the transistor trenches 103. Accordingly, in connection with the configuration of the semiconductor device of the second embodiment, only the memory cell transistors MT are provided in the transistor trenches 103. The ferroelectric capacitors $C_{FE}$ are arranged on the semiconductor substrate 11 in series along the direction X in which the bit lines BL extend and in electrically parallel to the source/drain regions 17 of the respective memory cell transistors MT.

As shown in FIGS. 7, 8A and 8B, a semiconductor device of the second embodiment has the semiconductor substrate 11; the element isolation trenches 101 that are formed in the semiconductor substrate 11, that extend in the direction X, and that have the first depth; the transistor trenches 103 that are formed in the semiconductor substrate 11, that extend in the direction Y crossing the element isolation trench 101, and that have the second depth shallower than the first depth; and the element isolation regions 13 formed by embedding the respective element isolation trenches 101 with an insulating film.

The semiconductor device is provided with the gate electrodes 16a, 16b, 16c, and 16d which are placed in the respective transistor trenches 103 through the gate insulting film 15 and which extend in the direction Y; and the interlayer insulating film 14 which is formed on the gate electrodes 16a, 16b, 16c, and 16d in the respective transistor trenches 103. The semiconductor device is further provided with the source regions 17 provided in the respective first semiconductor pillars formed from portions of the semiconductor substrate 11 located close to one side of the respective transistor trench 103; and the drain regions 17 provided in the respective second semiconductor pillars formed from portions of the semiconductor substrate 11 located close to the other side of the transistor trenches 103.

The semiconductor device also has the ferroelectric capacitors $C_{FE}$. Each of the capacitors is arranged on the source region 17, the drain region 17 and the interlayer dielectric film 14. Each of the capacitors includes the source electrode 26 connected to the source region 17, the drain electrode 26 connected to the drain region 17, and the ferroelectric film 27 that is disposed on the interlayer dielectric film 14 and disposed between the source electrode 26 and the drain electrode 26.

Moreover, as shown in FIG. 8A, the interlayer insulating film 32 is placed on the semiconductor substrate 11. The semiconductor device includes the first metal electrode layer 35 formed in an embedded manner in the interlayer insulating film 32. Further, the semiconductor device has the bit line contact plugs 34 which each connect the first metal electrode layer 35 to the source/drain regions 17 in the semiconductor substrate 11; and the second metal electrode layers 37, 38, and 39 formed in an embedded manner in an interlayer insulating film 36 laid on the first metal electrode layer 35.

An insulating film is embedded in the respective element isolation trenches 101 extending in the direction X, thereby forming the element isolation regions 13. The transistor trenches 103 are formed so as to extend in the direction Y orthogonal to the element isolation regions 13. Moreover, the gate electrodes 16a, 16b, 16c, and 16d are embedded in the respective transistor trenches 103 through the gate insulating film 15 so as to extend in the direction Y.

The source/drain electrodes 17 are formed in the respective semiconductor pillar 106 which are each determined from the element isolation trench 101 and the transistor trench 103. The interlayer insulating film 14 is provided essentially in level with the semiconductor pillars 106 and on the gate electrodes 16a, 16b, 16c, and 16d in the respective transistor trenches 103.

The source/drain electrodes 26 are provided on the respective source/drain regions 17, and the ferroelectric film 27 is formed on the interlayer dielectric films 14 between the source/drain electrodes 26. Moreover, the ferroelectric capacitors $C_{FE}$ are formed electrically in parallel among the source/drain regions 17 of the memory cell transistors MT.

As shown in FIGS. 7 and 8A, the memory cell transistors MT respectively having the gate electrodes 16b, 16c, and 16d are connected in series in the direction X, thereby forming a group called a block. The block selection transistor ST having the gate electrode 16a is formed at the end of the block and in the structure of an embedded transistor that is identical to the structure of the memory cell transistor MT.

The bit line contact plugs 34 is placed in one of the semiconductor pillars 106 of each block selection transistor ST and connected to each bit line BL formed from the metal electrode layer 35. As a result, the thickness of the interlayer insulating film 32 between the first metal electrode layer 35 and the semiconductor substrate 11 can be made thicker when compared with the counterpart film in the structure of the semiconductor device of the first embodiment, by an amount corresponding to the height of the ferroelectric capacitors $C_{FE}$ of a landscape structure formed on the surface of the semiconductor substrate 11. Moreover, the memory cell transistors MT and the block selection transistor ST are formed in the respective transistor trenches 103 in a fully-embedded fashion. Therefore, the element isolation trenches 101 and the transistor trenches 103 can be formed shallowly.

In the meantime, an example of a diagrammatic cross-sectional structure of the control circuit section in the semiconductor device of the second embodiment is shown in FIG. 8B.

The semiconductor substrate 11, the element isolation regions 43, the source/drain regions 40, the gate insulating film 41 formed on areas of the semiconductor substrate 11 located between the source/drain regions 40; and the gate electrodes 42 placed on the gate insulating film 41 are provided. The control circuit section is provided with the contact plugs 44 located on the respective source/drain regions 40 and the first metal electrode layer 46 placed on each of the contact plugs 44. The control circuit section also includes the interlayer insulating film 72 laid on the semiconductor substrate 11, the interlay insulating film 76 laid on the first metal electrode layer 46, and the second metal electrode layers 47, 48, and 49 formed so as to be embedded in the interlayer insulating film 76 on the first metal electrode layer 46.

The element isolation regions 43 may also be formed concurrently with formation of the element isolation regions 13 of the memory cell section. The source/drain regions 40 may also be formed concurrently with formation of the source/drain regions 17 of the memory cell section. The contact plugs 44 placed on the respective source/drain regions 40 may also be formed concurrently with formation of the bit line contact plugs 34 of the memory cell section. The first metal electrode layer 46 laid on the contact plugs 44 may also be formed concurrently with formation of the first metal electrode layer 35 of the memory cell section. The interlayer insulating film 76 laid on the semiconductor substrate 11, the gate electrodes 42, and the first metal electrode layer 46 may also be formed concurrently with formation of the interlayer insulating film 36 of the memory cell section. The second metal electrode layers 47, 48, and 49 formed so as to be embedded in the interlayer insulating film 76 on the first metal electrode layer 46 may also be formed concurrently with formation of the second metal electrode layers 37, 38, and 39 of the memory cell section.

In the semiconductor device of the second embodiment, the source/drain electrodes 26 are formed on the semiconductor pillars 106, and the ferroelectric film 27 is formed, in an embedded manner, between the source/drain electrodes 26 on the interlayer dielectric film 14. As a result, the ferroelectric capacitors $C_{FE}$ of the landscape structure are formed on the semiconductor substrate 11. The height of the structure consisting of the ferroelectric capacitors $C_{FE}$ formed on the semiconductor substrate 11 becomes increased, and the depth of the bit line contact plugs 34 increases. However, the memory cell transistors MT and the block selection transistors ST are formed beneath the semiconductor substrate 11 so as to assume the structure of an embedded transistor. Hence, the element isolation trenches 101 and the transistor trenches 103 forming the embedded transistors can be formed shallowly, and formation of the memory cell transistors MT and the block selection transistors ST in the memory cell section is facilitated.

(Manufacturing Method)

The method for manufacturing a semiconductor device of the second embodiment is shown in FIGS. 3A-4B and FIGS. 9-15B.

The method includes the processes of: forming, in the semiconductor substrate 11, the element isolation trenches 101 that have the first depth and that extend in the direction X; and forming the embedded element isolation regions 13 in the respective element isolation trenches 101. Moreover, the method includes the processes of: forming, in the semiconductor substrate 11, the transistor trenches 103 which extend in the direction Y crossing the element isolation trench 101 and which each have the second depth shallower than the first depth; and forming the gate electrodes 16a, 16b, 16c, and 16d—which extend in the direction Y—in the respective transistor trenches 103 through the gate insulating film 15. The method includes the processes of: forming the interlayer insulating film 14 on the gate electrodes 16a, 16b, 16c, and 16d in the respective transistor trenches 103; and forming the source regions 17 in the respective first semiconductor pillars formed from portions of the semiconductor substrate 11 close to one side of the respective transistor trenches 103 and the drain regions 17 in the respective second semiconductor pillars formed from portions of the semiconductor substrate 11 close to the other side of the respective transistor trenches 103. The method further includes the processes of: forming the ferroelectric capacitors $C_{FE}$, each of which is positioned on the source regions 17, the drain regions 17, and the interlayer insulting film 14 along the direction X and which includes the source electrode 26 connected to the source region 17, the drain electrode 26 connected to the drain region 17, and the ferroelectric film 27 interposed between the source electrode and the drain electrode.

FIGS. 9-15B are descriptive views of one process of manufacturing the semiconductor device of the second embodiment. FIGS. 10A, 11A, 12A, 13A, 14A and 15A are diagrammatic perspective views of the memory cell section. FIGS. 10B, 11B, 12B, 13B, 14B and 15B are diagrammatic cross-sectional views of the control circuit section.

The method for manufacturing the semiconductor device of the second embodiment will be described in detail hereunder.

Processing up to the process for forming element isolation regions shown in FIGS. 3A and 3B and the process for forming an embedded transistor structure shown in FIGS. 4A and 4B is the same as the counterpart processes of the method for manufacturing the semiconductor device of the first embodiment.

(a) The process for forming element isolation regions can be performed in the same manner as is the element isolation region forming process of the first embodiment shown in FIGS. 3A and 3B. However, the depth of the element isolation trenches 101 of the semiconductor device of the second embodiment can be made smaller than the depth of the element isolation trenches 101 of the semiconductor device of the first embodiment shown in FIGS. 3A and 3B.

As in the case of FIG. 3A, after the silicon oxide film and the silicon nitride file have been deposited on the semiconductor substrate 11 formed from; e.g., silicon, and the element isolation trenches 101 are formed, in the memory cell section, so as to extend in the direction X. Subsequently, the element isolation trenches 101 are embedded with an insulating film, such as TEOS, to thus form the element isolation regions 13. Moreover, the element isolation regions are planarized by means of CMP, to thus make the nitride film 12 exposed. Likewise, as in the case of FIG. 3B, the element isolation trenches 101 are formed concurrently with formation of the element isolation trenches 101 of the memory cell section in the control circuit section, and the element isolation trenches 101 are embedded with an insulating film, such as TEOS, to thus form the element isolation regions 43. Moreover, the element isolation regions are planarized by means of CMP, to thus make the nitride film 12 exposed.

(b) The process for fabricating embedded transistors can be performed in the same manner as is the embedded transistor formation process of the first embodiment shown in FIGS. 4A and 4B.

The depth of the transistor trenches 103 of the semiconductor device of the second embodiment can be made smaller than the depth of the transistor trenches 103 of the semiconductor device of the first embodiment shown in FIGS. 4A and 4B.

As in the case of FIG. 4A, the transistor trenches 103 are formed so as to extend in the direction Y orthogonal to the element isolation trenches 101 in the memory cell section. Moreover, after the gate insulating film 15 has been formed from a silicon oxide film, or the like, in the transistor trenches 103, the gate electrodes 16a, 16b, and 16c formed from; for example, doped amorphous silicon, are deposited. The gate electrodes are abraded by means of CMP, or the like, to thus become planarized. Further, the gate electrodes 16a, 16b, and 16c formed from a doped amorphous silicon layer are subjected to recess-etching by means of etchback treatment. The interlayer insulating film 14, such as a TEOS, is further deposited, and the film is polished and planarized by means of CMP, or the like, thereby making the nitride film 12 exposed.

(c) FIG. 9 shows a view achieved after completion of a process for forming the semiconductor pillars 106. The process for forming the semiconductor pillars 106 can be performed in the same manner as is the process for forming the semiconductor pillars 106 of the first embodiment shown in FIG. 5.

The height of the semiconductor pillars 106 of the semiconductor device of the second embodiment can be made smaller than the height of the semiconductor pillars 106 of the semiconductor device of the first embodiment shown in FIG. 5.

After formation of the embedded transistor structure shown in FIGS. 4A and 4B, the interlayer insulating film 14, such as TEOS, is subjected to recess-etching by means of reactive ion etching (RIE) which is highly selective with regard to the nitride film 12. Resultantly, the semiconductor pillars 106 are automatically caused to appear. Moreover, after removal of the nitride film 12 in the memory cell section, the source/drain regions 17 are formed by means of ion implantation or a diffusion process.

The process for forming the source/drain regions 17 is not necessarily be performed after formation of the semiconductor pillars 106. Specifically, after the source/drain regions 17 have been formed by means of a well diffusion process or an ion implantation process, the process for forming element isolation regions shown in FIGS. 3A and 3B may also be commenced.

(d) As shown in FIGS. 7 and 10A, after the insulating film, such as TEOS, has been deposited over the entire surface of the memory cell section, the film is planarized by means of CMP, or the like. Consequently, the insulating film, such as TEOS, is embedded into the element isolation trenches 101 up to the upper surfaces of the respective semiconductor pillars 106, thereby forming the element isolation regions 13. Moreover, the insulating film, such as TEOS, is deposited on the interlayer insulating film 14 in each of the transistor trenches 103 up to the upper surfaces of the respective semiconductor pillars 106.

Next, a gate insulating film 19 is formed over the semiconductor surfaces of the source/drain regions 17 exposed in the planarization process, in a thermal oxidation process, or the like.

Likewise, as shown in FIG. 10B, after removal of the nitride film 12, the gate insulating film 19 is formed in the control circuit section in the thermal oxidation process, or the like. Moreover, gate electrodes 21 are formed in processes for depositing a polysilicon layer and patterning. Subsequently, the source/drain regions 40 are formed in the self-alignment process by means of ion implantation, thereby fabricating the transistors of the control circuit section.

The transistors of the control circuit section may also be fabricated after fabrication of the embedded transistors of the memory cell section shown in FIG. 4A. Moreover, the process for forming the gate insulating film 19 shown in FIGS. 10A and 10B may also be performed concurrently.

(e) As shown in FIGS. 11A and 11B, a protective film 22, such as a nitride film, which serves as an etch stopper is deposited over the entirety of the memory cell section and that of the control circuit section. Subsequently, an interlayer insulating film 23 made of; e.g., TEOS, BSG, PSG, BPSG, or the like, is deposited over the entirety of the protective film 22.

(f) As shown in FIGS. 12A and 12B, the interlayer insulating film 23 of the memory cell section is selectively removed through wet etching, or the like, to thus make the protective film 22, such as a nitride film, exposed.

As shown in FIG. 12B, the interlayer insulating film 23 in the control circuit section is taper-etched by means of wet etching, to thus be formed into a smooth surface while generation of a stepped structure is avoided.

(g) As shown in FIGS. 13A and 13B, the protective film 22 of the memory cell section is removed while the interlayer insulating film 23 of the control circuit section is taken as a mask material.

(h) As shown in FIGS. 14A and 14B, the upper surfaces of the semiconductor pillars 106 are exposed in the memory cell section by means of wet processing. Subsequently, Ir, or the like, is deposited over the entirety of the memory cell section and the entirety of the control circuit section by means of sputtering, thereby forming the metal electrode layer 24 that is to come to be the source/drain electrodes 26.

Figures 15A, 15B:
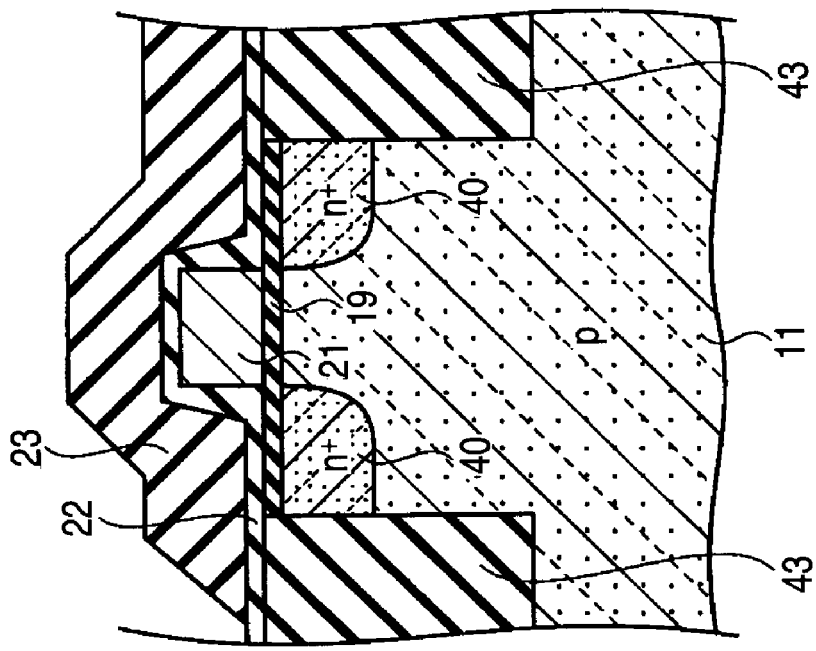
FIG. 15A is a diagrammatic cross-sectional view of the memory cell section of one step in a method for manufacturing the semiconductor device of the second embodiment.
FIG. 15B is a diagrammatic cross-sectional view of the control circuit section of one step in a method for manufacturing the semiconductor device of the second embodiment.

(i) As shown in FIGS. 15A and 15B, the metal electrode layer 24 formed from Ir, or the like, is patterned by means of RIE, or the like, to thus form the source/drain electrodes 26 on the respective source/drain regions 17.

The material for the source/drain electrodes 26 is not limited to Ir. There may also be adopted $IrO_2$; a multilayer consisting of Ir and Pt; a multilayer structure consisting of $IrO_2$ and Pt; Pt, $IrO_2$, and SrRuO; or a multilayer structure consisting of Pt, $IrO_2$, and SrRuO.

Moreover, for instance, a silicon oxide film, a TiN film, a TiAlN film, and the like, can be used as a material for a mask used at the time of patterning of the source/drain electrodes 26.

(j) As shown in FIGS. 16A and 16B, the ferroelectric film 27, such as a PZT film, is deposited in the memory cell section and the control circuit section, by means of MOCVD or like processing. Subsequently, the ferroelectric film 27 is formed among the source/drain electrodes 26 by means of total etch-back. Concurrently, the ferroelectric film 27 deposited on planar portions of the memory cell sections and planar portions of the control circuit section is removed.

The material for the ferroelectric film 27 is not limited to PZT; and an SBT film, a BLT film, and the like, may also be used.

Moreover, for example, a silicon oxide film, a TiN film, a TiAlN film, and the like, can also be used as a mask material employed at the time of patterning of the ferroelectric film 27.

(k) As shown in FIG. 8A, after deposition of the interlayer insulating film 32, the bit line contact plug 34 is formed on the source/drain region 17 of the block selection transistor ST. Moreover, the first metal electrode layer 35 is formed on the bit line contact plug 34, and the interlayer insulating film 36 is further formed on the first metal electrode layer 35. Still, the second metal electrode layers 37, 38, and 39 are formed so as to be embedded in the interlayer insulating film 36.

The first metal electrode layer 35 and the second metal electrode layers 37, 38, and 39 may also be formed in the metal damascene process.

Likewise, as shown in FIG. 8B, after deposition of the interlayer insulating film 72, the contact plugs 44 are formed on the respective source/drain regions 40. Further, the first metal electrode layer 46 is formed on each of the contact plugs 44. The interlayer insulating film 76 is formed on the first metal electrode layer 46, and the second metal electrode layers 47, 48, and 49 are formed so as to become embedded in the interlayer dielectric film 76.

The first metal electrode layer 46 and the second metal electrode layers 47, 48, and 49 may also be formed through a metal damascene process.

In the above processes, simultaneously forming the interlayer insulating film 32 and the interlayer insulating film 72, simultaneously forming the bit line contact plugs 34 and the contact plugs 44, simultaneously forming the first metal electrode layer 35 and the first metal electrode layer 46, simultaneously forming the interlayer insulating film 36 and the interlayer insulating film 76, and simultaneously forming the second metal electrode layers 37, 38, and 39 and the second metal electrode layers 47, 48, and 49 are effective for enabling a decrease in the number of manufacturing processes.

The bit line contact plugs 34 and the contact plugs 44 are formed from a metal layer; for example, W, Cu, or the like. Moreover, the first metal electrode layers 35 and 46 and the second metal electrode layers 37, 38, 39, 47, 48, and 49 are formed from an Al electrode. Alternatively, the first metal electrode layers 35 and 46 and the second metal electrode layers 37, 38, 39, 47, 48, and 49 may also be formed from silicide, such as W silicide, Cu silicide, Mo silicide, Pt silicide, Cu silicide, Co silicide, or the like.

The memory cell section and the control circuit section are formed in the semiconductor device of the second embodiment through the processes.

According to the semiconductor device and the method for manufacturing the same of the second embodiment, the memory cell transistors can be formed within the semiconductor substrate in an embedded manner. Therefore, the element isolation trenches and the transistor trenches can be formed to smaller depths. A decrease in the yield of the contact plugs can be prevented, and memory cell transistors can be fabricated readily in the memory cell section.

Third Embodiment

As shown in FIG. 17, a three-dimensional structure of a semiconductor device according to a third embodiment includes the semiconductor substrate 11; the element isolation trenches 101 that are formed in the semiconductor substrate 11, that extend in the direction X, and that have the first depth; the transistor trenches 103 that are formed in the semiconductor substrate 11, that extend in the direction Y crossing the element isolation trench 101, that have the second depth shallower than the first depth, and that have the upper region and the lower region; and the element isolation regions 13 formed by embedding the respective element isolation trenches 101 with an insulating film.

The semiconductor device is provided with the gate electrodes 16a, 16b, 16c, and 16d which are placed in lower regions of the respective transistor trenches 103 through the gate insulting film 15 and which extend in the direction Y; and the interlayer insulating film 14 formed on the gate electrodes 16a, 16b, 16c, and 16d in the respective transistor trenches 103. The semiconductor device is further provided with the source regions 17 is provided in the respective first semiconductor pillars formed from portions of the semiconductor substrate 11 located close to one side of the respective transistor trenches 103; and the drain regions 17 provided in the respective second semiconductor pillars formed from portions of the semiconductor substrate 11 located close to the other side of the respective transistor trenches 103.

The semiconductor device also has the ferroelectric capacitors $C_{FE}$. Each of the capacitors is arranged, along the direction X, in an upper portion of the transistor trench 103 between the first semiconductor pillar 106 and the second semiconductor pillar 106; and includes the source electrode 26 connected to the source region 17, the drain electrode 26 connected to the drain region 17, and the ferroelectric film 27 placed on the interlayer dielectric film 14 located between the source electrode and the drain electrode.

The source electrodes 26 are arranged along both sides of the respective first semiconductor pillars 106 with respect to the direction X and both sides of the same with respect to the direction Y, to thus enclose the sides of the respective first semiconductor pillars 106. The drain electrodes 26 are arranged along both sides of the respective second semiconductor pillars 106 with respect to the direction X and both sides of the same with respect to the direction Y, to thus enclose the sides of the respective second semiconductor pillars 106.

Moreover, the ferroelectric film 27 is arranged so as to surround the sides of the source electrodes 26 enclosing the first semiconductor pillars 106. In addition, the ferroelectric film 27 is arranged so as to surround the sides of the drain electrodes 26 enclosing the second semiconductor pillars 106. The ferroelectric films 27 are common-connected in the direction X but are separated from each other in the direction Y.

In each of the element isolation trenches 101, an insulating film, such as TEOS, is filled between the ferroelectric films 27 separated from each other in the direction Y, and the insulating film is planarized by means of CMP, or the like.

(Manufacturing Method)

The method for manufacturing a semiconductor device of the third embodiment is shown in FIGS. 3A-5 and FIG. 17.

The method includes the processes of: forming, in the semiconductor substrate 11, the element isolation trenches 101 that have the first depth and that extend in the direction X; and forming the embedded element isolation regions 13 in the respective element isolation trenches 101.

Moreover, the method includes the processes of: forming, in the semiconductor substrate 11, the transistor trenches 103 which extends in the direction Y crossing the element isolation trench 101 and which each have the second depth shallower than the first depth and an upper region and a lower region; and forming the gate electrodes 16a, 16b, 16c, and 16d—which extend in the direction Y—in the lower regions of the respective transistor trenches 103 through the gate insulating film 15.

The method includes the processes of: forming the interlayer insulating film 14 on the gate electrodes 16a, 16b, 16c, and 16d in the respective transistor trenches 103; and forming the source regions 17 in the respective first semiconductor pillars formed from portions of the semiconductor substrate 11 close to one side of the respective transistor trenches 103.

The method also includes the processes of: forming the drain regions 17 in the respective second semiconductor pillars formed from portions of the semiconductor substrate 11 close to the other side of the respective transistor trenches 103; and forming the ferroelectric capacitors $C_{FE}$, each of which is arranged, along the direction X, on the interlayer insulating film 14 and in an upper portion of the transistor trench 103 between the first semiconductor pillar and the second semiconductor pillar and which includes the source electrode 26 connected to the source region 17, the drain electrode 26 connected to the drain region 17, and the ferroelectric film 27 interposed between the source/drain electrodes 26.

Further, under the method for manufacturing the semiconductor device of the third embodiment, the source electrodes 26 are formed along both sides of the respective first semiconductor pillars 106 with respect to the direction X and both sides of the same with respect to the direction Y, to thus enclose the sides of the respective first semiconductor pillars 106.

The drain electrodes 26 are formed along both sides of the respective second semiconductor pillars 106 with respect to the direction X and both sides of the same with respect to the direction Y, to thus surround the respective second semiconductor pillars 106.

Moreover, the ferroelectric film 27 is formed so as to surround the source electrodes 26 enclosing the first semiconductor pillars 106. In addition, the ferroelectric film 27 is formed so as to surround the drain electrodes 26 enclosing the second semiconductor pillars 106. The ferroelectric films 27 are common-connected in the direction X but are separated from each other in the direction Y.

The method for manufacturing the semiconductor device of the third embodiment and the method for manufacturing the semiconductor device of the first embodiment share the common processes shown in FIGS. 3A-5, and hence their repeated explanations are omitted. The method for manufacturing the semiconductor device of the third embodiment will be described in detail hereunder.

(a) FIG. 17 shows a view achieved after completion of the process for forming mutually-opposing electrodes.

After the process for forming the semiconductor pillars 106 shown in FIG. 5, Ir is deposited on the exposed semiconductor pillars 106 by means of ADL, or the like, and Ir deposited on the bottom is removed through total etchback. Consequently, Ir is left only on the sides of the semiconductor pillars 106, thereby forming the source/drain electrodes 26 that serve as mutually-opposing electrodes.

(b) Subsequently, the ferroelectric films 27, such as a PZT film, are deposited by means of MOCVD, or the like. Under the method for manufacturing the semiconductor device of the third embodiment, the ferroelectric film 27 is formed so as to surround the respective source electrodes 26 enclosing the first semiconductor pillars 106, as shown in FIG. 17. Moreover, the ferroelectric film 27 is also formed so as to surround the respective drain electrodes 26 enclosing the second semiconductor pillars 106. These ferroelectric films 27 are common-connected in the direction X but are separated from each other in the direction Y.

The material for the source/drain electrodes 26 is not limited to Ir. There may also be adopted $IrO_2$; a multilayer structure consisting of Ir and Pt; a multilayer structure consisting of $IrO_2$ and Pt; Pt, $IrO_2$, and SrRuO; or a multilayer structure consisting of Pt, $IrO_2$, and SrRuO.

The material for the ferroelectric film 27 is not limited to PZT; and an SBT film, a BLT film, or the like, may also be adopted.

Moreover, for instance, a silicon oxide film, a TiN film, a TiAlN film, and the like, can be used as a material for a mask used at the time of patterning of the source/drain electrodes 26 and the ferroelectric films 27.

(c) After deposition of an insulating film, such as TEOS, over the entire substrate, the insulating film is planarized by means of CMP, or the like. Subsequently, an insulating film, such as TEOS, is embedded between the element isolation trenches 101, thereby forming the element isolation regions 13. An insulating film, such as TEOS, is provided, in an embedded manner, on the interlayer insulating films 14 corresponding to intersections of the element isolation trenches 101 and the transistor trenches 103. Consequently, the source/ drain electrodes 26 remaining adjacent to each other in the direction Y and the ferroelectric films 27 remaining adjacent to each other in the direction Y are insulated and separated from each other.

(e) Next, as in the case of processing shown in FIG. 2B of the first embodiment, after removal of the nitride film 12 in the control circuit section, the gate insulating film 41 and the gate electrode 42 of the respective transistors are formed. Subsequently, in the self-alignment process, the source/drain regions 40 are formed by means of ion implantation, and transistors of the control circuit section are fabricated. The transistors of the control circuit section may also be fabricated after fabrication of the embedded transistors in the memory cell section shown in FIG. 4A.

(d) As in the case of processing shown in FIG. 2A of the first embodiment, after deposition of the interlayer insulating film 32, the bit line contact plug 34 is formed on the source/drain region 17 of the block selection transistor ST, and the first metal electrode layer 35 is formed on the bit line contact plug 34. Moreover, the interlayer insulting film 36 is formed on the first metal electrode layer 35, and the second metal electrode layers 37, 38, and 39 are formed in the interlayer insulating film 36 in an embedded manner. The first metal electrode layer 35 and the second metal electrode layers 37, 38, and 39 may also be formed in the metal damascene process.

Similarly, as in the case of processing shown in FIG. 2B of the first embodiment, after deposition of the interlayer insulating film 72, the contact plugs 44 are formed on the respective source/drain regions 40, and the first metal electrode layer 46 is formed on the contact plugs 44. The interlayer insulating film 76 is formed on the first metal electrode layer 46, and the second metal electrode layers 47, 48, and 49 are formed in the interlayer insulating film 76 in an embedded manner. The first metal electrode layer 46 and the second metal electrode layers 47, 48, and 49 may also be formed in the metal damascene process.

In the above processes, simultaneously forming the interlayer insulating film 32 and the interlayer insulating film 72, simultaneously forming the bit line contact plugs 34 and the contact plugs 44, simultaneously forming the first metal electrode layer 35 and the first metal electrode layer 46, simultaneously forming the interlayer insulating film 36 and the interlayer insulating film 76, and simultaneously forming the second metal electrode layers 37, 38, and 39 and the second metal electrode layers 47, 48, and 49 are effective for enabling a decrease in the number of manufacturing processes.

The bit line contact plugs 34 and the contact plugs 44 are formed from a metal layer; for example, W, Cu, or the like. Moreover, the first metal electrode layers 35 and 46 and the second metal electrode layers 37, 38, 39, 47, 48, and 49 are formed from an Al electrode. Alternatively, the first metal electrode layers 35 and 46 and the second metal electrode layers 37, 38, 39, 47, 48, and 49 may also be formed from silicide, such as W silicide, Cu silicide, Mo silicide, Pt silicide, Cu silicide, Co silicide, or the like.

In the semiconductor device of the third embodiment, the memory cell section and the control circuit section are formed through the processes.

According to the semiconductor device and the method for manufacturing the same of the third embodiment, the memory cell transistors can be formed within the semiconductor substrate in an embedded manner. Therefore, the thickness of the interlayer insulating film from the surface of the semiconductor substrate to the first metal interconnect layer can be reduced. The contact plugs between the first metal interconnect layer and the semiconductor substrate can be formed shallowly. Thus, occurrence of a decrease in the production yield of the contact plugs can be prevented.

(Memory Cell Array)
(Chain-FeRAM™ Configuration)

A circuit configuration of a Chain-FeRAM™ cell block in which a plurality of cell units—to which the semiconductor devices of the first through third embodiments can be applied—are connected in series is diagrammatically represented as shown in FIG. 18. Since the Chain-FeRAM™ has a configuration in which memory cells, each of which is formed by connecting a memory cell transistor MT to a ferroelectric capacitor $C_{FE}$ in shunt with each other, are connected in series. For this reason, the FeRAM is called also as TC-unit-series-connected FeRAM.

As shown in; for example, FIG. 18, a unit cell of the Chain-FeRAM™ has a configuration in which both terminals of the ferroelectric capacitor $C_{FE}$ are connected to the source and drain of the memory cell transistor MT. As shown in FIG. 18, the plurality of such unit cells are arranged in series between a plate line PL and a bit line BL. A block of the Chain-FeRAM™ in which the plurality of unit cells are connected in series is selected by the block selection transistor ST. Word lines WL0, WL1, WL2, . . . , WL7 are connected to gates of the respective memory cell transistors MT, and a block selection line BS is connected to the gate of the block selection transistor ST.

Figure 19:
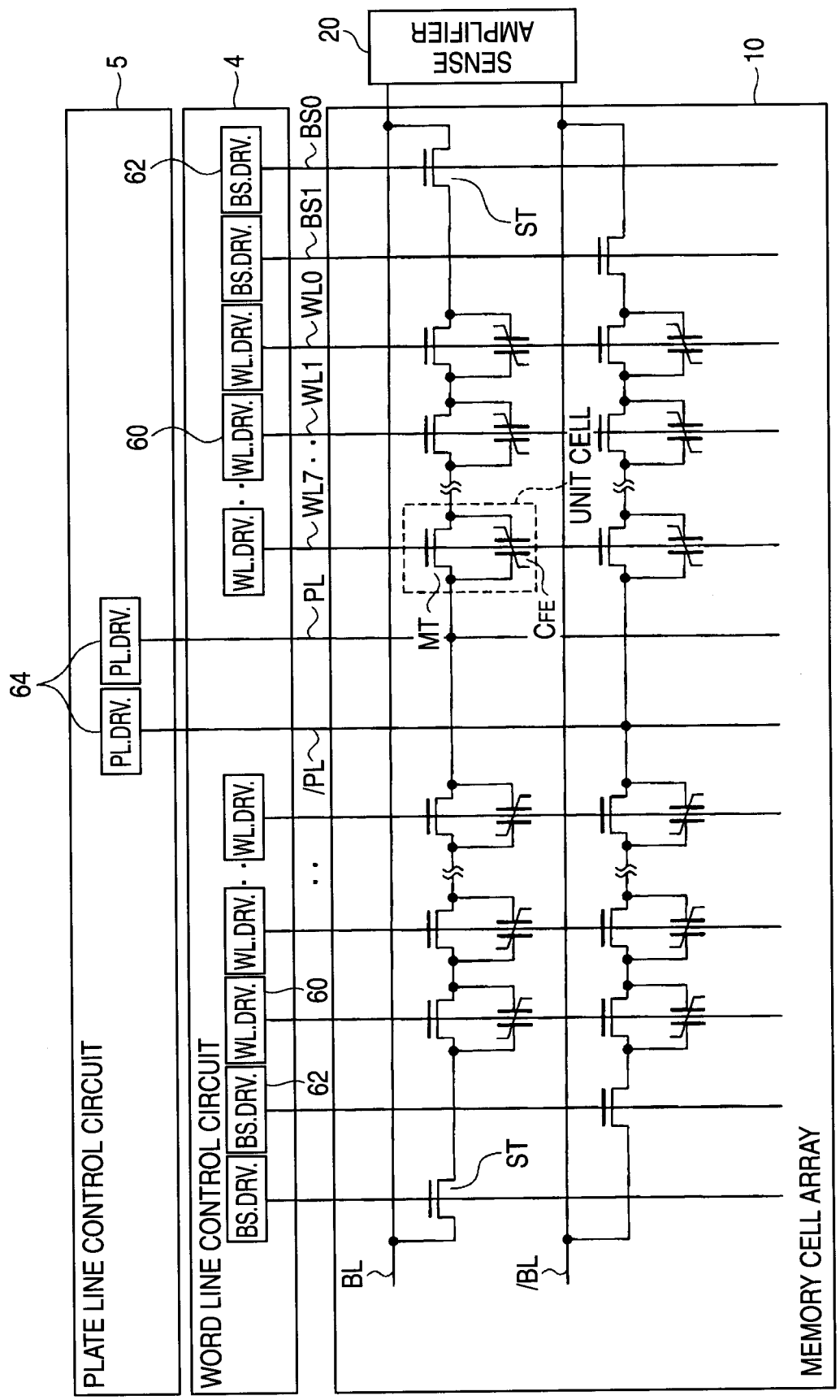
FIG. 19 is a diagrammatic block diagram of a Chain-FeRAM™ cell array that is an example memory cell array to which the semiconductor devices of the first through third embodiments can be applied.

The configuration of the block of the Chain-FeRAM™ that is an example of a memory cell array to which the semiconductor devices of the first through third embodiments can be applied, is diagrammatically represented as shown in FIG. 19. As shown in FIG. 19, the Chain-FeRAM™ cell array includes a memory cell array 10; a word line control circuit 4 connected to the memory cell array 10; and a plate line control circuit 5 connected to the word line control circuit 4. A plurality of Chain-FeRAM™ cells are connected in a matrix pattern in the memory cell array 10.

As shown in FIG. 19, a plurality of word lines WL (WL0 to WL7) are connected to word line drivers (WL. DRV.) 60 arranged in the word line control circuit 4. Block-selection lines BS (BS0 and BS1) are connected to block line selection drivers (BS. DRV.) 62 provided in the word line control circuit 4. In the meantime, plate lines PL (PL and /PL) are connected to plate line drivers 64 (PL. DRV.) arranged in the plate line control circuit 5.

As shown in FIG. 19, the memory cell array 10 has a configuration in which blocks of Chain-FeRAM™ are arranged in parallel to each other along a direction in which the word lines WL (WL0 to WL7) extend. Further, as shown in FIG. 19, the memory cell array 10 also has a configuration in which blocks of Chain-FeRAM™ become symmetrical about the plate lines PL (PL and /PL) along the direction in which the bit lines BL (BL and /BL) extend.

In the Chain-FeRAM™, a potential V (WL) of the word lines WL (WL0 to WL7) and a potential V (BS) of the block selection lines BS (BS0 and BS1) assume the potential of an internal power source VPP or a ground potential GND; for example, 0V. In a standby condition, the potential V (WL) of the word lines WL becomes equal to VPP, and the potential V (BS) of the block selection lines BS becomes equal to 0 (V). The potential V (PL) of the plate lines PL (PL, /PL) assumes a potential of an internal power source VINT or the ground potential GND. Further, in the standby condition, the potential V(PL) of the plate lines PL becomes equal to 0 (V).

A sense amplifier 20 is connected to the bit lines BL (BL, /BL). A micro-signal from the FeRAM cell is comparatively amplified by this sense amplifier 20, and a signal determined as a high level or a low level is read. In the standby condition, the potential V (BL) of the bit lines becomes equal to 0 (V)

Other Embodiments

As mentioned above, the present invention has been described by reference to the first to third embodiments. However, the descriptions and the drawings, which constitute portions of the disclosure, should not be construed to limit the present invention. Various modes of alternative practice, embodiments, and operational techniques will be manifest to those who are versed in the art.

The present invention naturally encompasses various modes which are not described herein, and others. Therefore, the technical scope of the present invention is determined by merely the matters that identify the invention and fall within the scope of the appending claims which are appropriate from the above descriptions.

What is claimed is:

1. A semiconductor apparatus comprising:
   a semiconductor substrate;
   an element isolation region formed in the semiconductor substrate so as to extend in a first direction;
   a gate electrode formed in the semiconductor substrate so as to extend in a second direction crossing the first direction and to penetrate through the element isolation region;
   a gate insulating film interposed between the gate electrode and the semiconductor substrate;
   an interlayer dielectric film formed on the gate electrode;
   a ferroelectric capacitor comprising:
      a first electrode that is disposed on the interlayer dielectric film,
      a second electrode that is disposed on the interlayer dielectric film, and that is separated from the first electrode, and
      a ferroelectric that is disposed on the interlayer dielectric film so that the first electrode, the ferroelectric and the second electrode are stacked in an order of the first direction and so that both side surfaces of the ferroelectric respectively contact the first electrode and the second electrode;
   a first semiconductor pillar that is in contact with the first electrode;
   a second semiconductor pillar that is in contact with the second electrode, the first semiconductor pillar, the second semiconductor pillar, the gate insulating film and the gate electrode forming a transistor;
   a second transistor that shares the first semiconductor pillar with the transistor; and
   a second ferroelectric capacitor that shares the first electrode with the ferroelectric capacitor.

2. The semiconductor apparatus according to claim 1, wherein the first electrode surrounds the first semiconductor pillar; and wherein the second electrode surrounds the second semiconductor pillar.

3. The semiconductor apparatus according to claim 2, wherein the ferroelectric surrounds the first electrode and the second electrode.

4. The semiconductor apparatus according to claim 1, wherein the first semiconductor pillar and the second semiconductor pillar comprise an impurity diffusion layer.

5. The semiconductor apparatus according to claim 4, wherein the transistor and the ferroelectric capacitor form a memory cell.

6. A semiconductor apparatus comprising:
   a semiconductor substrate comprising:
      a first semiconductor pillar,
      a second semiconductor pillar, and
      a trench formed between the first semiconductor pillar and the second semiconductor pillar;
   a gate insulating film formed in the trench;
   a gate electrode disposed on the gate insulating film;
   an interlayer dielectric film formed on the gate electrode; and
   a ferroelectric capacitor comprising:
      a first electrode that is disposed on the interlayer dielectric film and that is in contact with the first semiconductor pillar,
      a second electrode that is disposed on the interlayer dielectric film, that is in contact with the second semiconductor pillar and that is separated from the first electrode, and
      a ferroelectric that is disposed on the interlayer dielectric film and between the first electrode and the second electrode;
   wherein the first semiconductor pillar, the ferroelectric capacitor and the second semiconductor pillar form a continuous upper surface.

7. The semiconductor apparatus according to claim 6, wherein the first electrode, the ferroelectric and the second electrode are stacked in an order of a first direction so that both side surfaces of the ferroelectric respectively contact the first electrode and the second electrode.

8. The semiconductor apparatus according to claim 6, wherein the first semiconductor pillar and the second semiconductor pillar comprise an impurity diffusion layer; and wherein the first semiconductor pillar, the second semiconductor pillar, the gate insulating film and the gate electrode form a transistor.

9. The semiconductor apparatus according to claim 8, wherein the transistor and the ferroelectric capacitor form a memory cell.

* * * * *